US008238158B2

(12) United States Patent
Shelton et al.

(10) Patent No.: US 8,238,158 B2
(45) Date of Patent: Aug. 7, 2012

(54) PROGRAMMING OF MEMORY CELLS IN A NONVOLATILE MEMORY USING AN ACTIVE TRANSITION CONTROL

(75) Inventors: Douglas Edward Shelton, Wylie, TX (US); Bruce Lynn Pickelsimer, McKinney, TX (US); John Howard MacPeak, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 246 days.

(21) Appl. No.: 12/850,130

(22) Filed: Aug. 4, 2010

(65) Prior Publication Data
US 2012/0033491 A1    Feb. 9, 2012

(51) Int. Cl.
*G11C 11/34* (2006.01)
(52) U.S. Cl. ........... 365/185.03; 365/185.18; 365/185.2; 365/185.21; 365/185.22; 365/185.29; 365/185.33
(58) Field of Classification Search ............. 365/185.03, 365/185.18, 185.2, 185.21, 185.22, 185.29, 365/185.33
See application file for complete search history.

(56) References Cited

U.S. PATENT DOCUMENTS

| | | | |
|---|---|---|---|
| 5,422,842 A | 6/1995 | Cernea et al. | |
| 5,638,322 A * | 6/1997 | Lacey | 365/185.21 |
| 6,081,448 A * | 6/2000 | Pasotti et al. | 365/185.03 |
| 6,111,791 A * | 8/2000 | Ghilardelli | 365/185.21 |
| 6,219,279 B1 * | 4/2001 | Manolescu et al. | 365/185.18 |
| 6,222,762 B1 * | 4/2001 | Guterman et al. | 365/185.03 |
| 6,639,849 B2 * | 10/2003 | Takahashi et al. | 365/185.03 |
| 6,917,541 B2 * | 7/2005 | Shimbayashi et al. | 365/185.21 |
| 7,009,882 B2 * | 3/2006 | Chen | 365/185.18 |
| 7,139,196 B2 * | 11/2006 | Tran | 365/185.21 |
| 7,177,183 B2 * | 2/2007 | Scheuerlein et al. | 365/185.21 |
| 7,286,407 B2 * | 10/2007 | Nakai et al. | 365/185.18 |
| 7,355,903 B2 * | 4/2008 | Hung et al. | 365/185.2 |
| 7,397,702 B2 * | 7/2008 | Rolandi et al. | 365/185.22 |
| 7,573,748 B2 * | 8/2009 | Bedarida et al. | 365/185.21 |
| 7,656,712 B2 * | 2/2010 | Lisi et al. | 365/185.2 |
| 7,675,792 B2 * | 3/2010 | Bedeschi et al. | 365/185.22 |
| 7,710,784 B2 * | 5/2010 | Chu et al. | 365/185.22 |

OTHER PUBLICATIONS

Cernea et al., "A 34Mb 3.3V Serial Flash EEPROM for Solid-State Disk Applications", Digest of Technical Papers: Intl Solid State Circuits Conference, Paper TA 7.4 (IEEE, 1995), pp. 126, 127 and 350.
Chandelier et al., "Hot Carrier Self Convergent Programming Method for Multi-Level Flash Cell Memory", Proceedings of the 35th Annual International Reliability Physics Symposium (IEEE, 1997), pp. 104-109.

* cited by examiner

*Primary Examiner* — Trong Phan
(74) *Attorney, Agent, or Firm* — Rose Alyssa Keagy; Wade J. Brady, III; Frederick J. Telecky, Jr.

(57) ABSTRACT

An electrically programmable non-volatile memory array and associated circuitry, including programming circuitry that adaptively senses completed programming of a selected memory cell. A programming bit line driver is connected to the bit line, and a first transistor has its source/drain path connected in series with the memory cell, and its gate connected to the output of the current comparator. As the MOS transistor in the selected cell becomes programmed, its drain current drawn from the bit line driver decays, and a remainder current into the current comparator increases. Upon the remainder current exceeding the reference current, the comparator turns off the first transistor; a second transistor connected between the source and drain of the cell transistor is turned on. In another approach, a summed current controls the gates of the first and second transistors. Programming terminates, and over-programming is avoided.

34 Claims, 11 Drawing Sheets

PROGRAMMING OF MEMORY CELLS IN A NONVOLATILE MEMORY USING AN ACTIVE TRANSITION CONTROL

BACKGROUND OF THE INVENTION

This invention is in the field of nonvolatile semiconductor memory. Embodiments of this invention are more specifically directed to the programming of memory cells in an electrically erasable non-volatile memory.

Non-volatile solid-state read/write memory devices are now commonplace in many electronic systems, particularly in portable electronic devices and systems. A common technology for realizing non-volatile solid-state memory devices involves the trapping of charge at or near the gate element of a metal-oxide-semiconductor (MOS) transistor in the programmable memory cell. For example, electrically erasable programmable "read-only" memory (EEPROM) devices utilize "floating-gate" transistors to store the data state. According to this conventional technology, the memory cell transistor is "programmed" by biasing it so that electrons tunnel through a thin dielectric film onto an electrically isolated transistor gate element. Depending on the construction of the transistor, the tunneling mechanism may be Fowler-Nordheim tunneling or channel "hot" carrier injection. Another type of charge-trapping programmable memory cell involves the trapping of charge within the gate dielectric layer underlying the transistor gate element, or in some cases at the physical interface of the gate dielectric with silicon. In either case, trapped electrons at the gate region raise the apparent threshold voltage of the memory cell transistor (for n-channel devices), as compared with the threshold voltage with no electrons trapped at the gate. The stored state can be read by sensing the presence or absence of source-drain conduction under bias.

Modern EEPROM devices are "erasable" in that the memory cell transistors can be biased to remove the electrons from the floating gate, by reversing the tunneling mechanism. Some EEPROM memory devices are of the "flash" type, in that a large number (a "block") of memory cells can be simultaneously erased in a single operation. Conventional EEPROM memories can be arranged in a "NOR" fashion, which permits individual cells in each column to be separately and individually accessed. Flash EEPROM memories are also now commonly arranged as "NAND" memory, in which the source/drain paths of a group of memory cells in a column are connected in series. NAND memories can be constructed with higher density, but require all of the cells in a group to be biased to access any one of the cells in that group.

Because of the convenience and efficiency of modern flash EEPROM memories, it is now desirable and commonplace to embed EEPROM memory within larger scale integrated circuits, such as those including modern complex microprocessors, microcontrollers, digital signal processors, and other large-scale logic circuitry. Such embedded EEPROM can be used as non-volatile program memory storing software routines executable by the processor, and also as non-volatile data storage.

According to one approach, floating-gate EEPROM cells are realized by MOS transistors having two polysilicon gate electrodes. A control gate electrode in one polysilicon level is electrically connected to decode and other circuitry in the EEPROM integrated circuit, and a floating gate in another polysilicon level is disposed between the control gate electrode and the channel region of the memory transistor. In this conventional construction, the application of a high programming voltage to the control gate capacitively couples to the floating gate, and attracts electrons from the source and drain regions of the transistor to such an extent that some tunnel to, and remain trapped on, the floating gate. FIG. 1a illustrates the electrical arrangement of conventional EEPROM memory cell 2 constructed according to this double-polysilicon construction. Memory cell 2 consists essentially of a single transistor with its drain connected to bit line BL, its source at ground, and its control gate connected to word line WL. A floating gate electrode is physically disposed between the control gate and the channel region of the transistor of memory cell 2, and is thus electrically isolated from the control gate, source, and drain of the transistor. The specific physical arrangement of the floating gate relative to the other elements of memory cell 2 can vary, depending on the particular design, as known in the art.

FIG. 1b illustrates a conventional arrangement of a non-volatile memory including array 5. Array 5 includes floating-gate EEPROM memory cells 2, arranged in rows and columns. While the number of memory cells 2 in array 5 shown in FIG. 1b is very small (sixteen cells 2, in four rows and four columns), for purposes of this description, typical conventional EEPROM arrays include many more cells. Indeed, some modern non-volatile memories include thousands of memory cells 2 on a common word line. In array 5 of FIG. 1b, each row of memory cells 2 shares a common one of word lines WL0, WL1, WL2, WL3, each driven by one word line drivers 6. Each column of memory cells 2 shares a common one of bit lines BL0, BL1, BL2, BL3, each driven by one of bit line drivers 4 and coupled to one of sense amplifiers 8.

In both read and write operations, one of word lines WL0, WL1, WL2, WL3 is selected according to a row portion of an address value, and driven active by the corresponding one of word line drivers 6. As will be described in further detail below, the voltages applied in read and write operations differ. In a write or "program" operation, one or more of bit lines BL0, BL1, BL2, BL3 is selected, according to a column portion of an address value, and is driven by its corresponding one of bit line drivers 4 with the appropriate programming voltage corresponding to the data state to be written as indicated on input data lines DATA IN (i.e., whether the cell is to be programmed or not). In a read operation, bit line drivers 4 bias one or more of bit lines BL0, BL1, BL2, BL3, and sense amplifiers 8 sense the state of one or more of bit lines BL0, BL1, BL2, BL3. The particular columns from which data are to be read can be selected, in response to a column portion of the address value, by either bit line drivers 4, sense amplifiers 8, or by circuitry downstream from sense amplifiers 8. The state of the selected memory cells 2 are output from sense amplifiers 8 on lines DATA OUT.

In conventional floating-gate EEPROMs, as mentioned above, an absence of trapped electrons is the "erased" state of the memory cell, and is evident by the (n-channel) floating-gate transistor having a low threshold voltage. This state is typically considered to be a logical "1", as drain-to-source current is conducted in response to a read voltage applied at the control gate. The "programmed" state in which electrons are trapped on the floating gate results in the floating-gate transistor having a high threshold voltage, in which source/drain current does not conduct with a read voltage applied to the control gate; this state is typically considered to be a logical "0".

The programming of a "0" state into memory cell 2, constructed in this double-gate manner, is typically performed by the application of a high voltage at the control gate along with a relatively strong drive (voltage and current) at the drain of the floating-gate transistor of memory cell 2, with the source of the transistor at ground. For example, in one conventional technology, a programming voltage of about 9.2 volts is applied to the control gate of memory cell 2 being programmed, in combination with a voltage of about 4.2 volts to the drain of the floating-gate transistor of memory cell 2, both voltages relative to the ground level at the source of that transistor. The physical mechanism involved in the programming operation is Fowler-Nordheim tunneling of "hot" electrons from the transistor channel region through the gate dielectric and into the floating gate electrode, to which the high control gate voltage is capacitively coupled. The high voltages and relatively high currents (e.g., on the order of 150 µA/bit) required by the programming mechanism are commonly generated by on-chip charge pump circuits. Typical programming cycle times are relatively long (e.g., on the order of microseconds), and include not only the duration of the programming pulse but also significant rise and fall times for the high voltage levels. These long programming times are in sharp contrast with the relatively fast read access cycle times (e.g., below 100 nsec), and as such various memory management techniques are used to reduce the system impact of the programming cycles.

The observed response of EEPROM cells to hot carrier programming varies from cell to cell, and from device (i.e., integrated circuit) to device. These variations in programmability are due to structural variations among the floating gate transistors, and manufacturing and processing variations from wafer to wafer. In addition, the programmability for a given EEPROM cell will vary over its operating life, primarily with the number of program/erase cycles that the cell undergoes over its life. As such, one cannot be sure of the extent that an EEPROM cell is actually programmed (i.e., the number of hot carriers that are actually trapped on the floating gate, and the effect of those trapped carriers) in response to a given set of programming pulses. Modern EEPROM memories are thus typically programmed, in system use, by way of program-and-verify cycles. Conventional program-and-verify cycles consist essentially of a program cycle, followed by a read cycle to determine whether the cell has been programmed to the desired level; if so, programming to that cell is stopped to avoid "over-programming", especially in multi-level cell (MLC) memories in which each memory cell is programmed to any one of three or more data states. In many modern EEPROM memories, programming pulses are applied to multiple cells simultaneously, with those cells that are not to be programmed (or, in the case of a previously programmed or newly-verified cell, not to be further programmed) masked from receiving programming pulses.

Of course, the necessity of performing a verify operation after one or more programming pulses greatly lengthens the overall programming cycle time. In addition, the program-and-verify approach, especially in MLC memories, requires that the programming operation itself be broken into a number of shorter programming pulses, each followed by a verify, to provide some granularity in the eventual programmed state. In those EEPROM memories in which multiple cells in the same "page" are programmed simultaneously, circuitry must also be provided to data mask those cells that are not to receive programming pulses, whether because the cell is to remain erased or is already programmed. These inefficiencies in EEPROM design, layout, and operation reduce memory density and performance.

By way of further background, U.S. Pat. No. 5,422,842, and in Cernea et al., "A 34 Mb 3.3V Serial Flash EEPROM for Solid-State Disk Applications", *Digest of Technical Papers, 1995 IEEE International Solid-State Circuits Conference*, Paper TA 7.4, pp. 126, 127, 350, describe programming of flash EEPROM cells by way of a convergent programming method based on monitoring the drain current into the cell being programmed. According to this approach, a reference current is applied to a current mirror sense amplifier, to control the programming current applied to the cell; logic coupled to the sense amplifier senses a drop in the current conducted by the cell as it becomes programmed, and disconnects the bit line from the programming voltage as a result. A similar simultaneous program-and-verify approach is described in Candelier et al., "Hot Carrier Self Convergent Programming Method for Multi-Level Flash Cell Memory", *Proceedings of the 35th Annual International Reliability Physics Symposium* (IEEE, 1997), pp. 104-09.

BRIEF SUMMARY OF THE INVENTION

Embodiments of this invention provide an electrically programmable charge storage memory, and method of operating the same, in which memory cells can be accurately programmed without separate verify operations.

Embodiments of this invention provide such a memory and method in which the programming current is self-compensated by the cell being programmed itself.

Embodiments of this invention provide such a memory and method in which the programmed level can be easily set or changed without affecting the programming current applied to the cell.

Embodiments of this invention provide such a memory and method in which a data mask is not required in order to avoid over-programming a previously programmed cell.

Other objects and advantages provided by embodiments of this invention will be apparent to those of ordinary skill in the art having reference to the following specification together with its drawings.

The present invention may be implemented into an integrated circuit containing a non-volatile memory array of MOS transistor memory cells that are programmable by charge trapping. Programming circuitry includes, for each bit line, a coupling transistor in series with the memory cell as it conducts programming current from the bit line. One input of a current comparator receives a reference current, and another input is coupled in parallel with the cell being programmed. Upon the drain current of the cell decaying as it becomes programmed, a remainder current to the current comparator input will increase, tripping the comparator output and turning off the coupling transistor, stopping the programming operation.

In another aspect of the invention, the remainder current is applied to a current mirror, which produces a current that is summed with a reference current. In this aspect of the invention, the reference current is initiated responsive to the programming current being applied. An amplifier generates a control voltage based on the sum of the remainder and reference currents. The control voltage is applied to the coupling transistor, to stop the programming operation upon the sum of the remainder and reference currents reaching the threshold voltage of the coupling transistor.

DETAILED DESCRIPTION OF THE INVENTION

This invention will be described in connection with one or more of its embodiments, namely as implemented into an integrated circuit as an embedded solid-state non-volatile flash electrically erasable read-only (EEPROM) memory, for example in which the memory cells are constructed as double-polysilicon floating-gate transistors, because it is contemplated that this invention will be especially beneficial in such an application. However, it is contemplated that this invention can provide important benefits in other applications, including other types of non-volatile memory programmable by way of trapped charge, whether realized as embedded memory within a large scale integrated circuit or as a stand-alone non-volatile memory of any one of a number of various types and construction. Accordingly, it is to be understood that the following description is provided by way of example only, and is not intended to limit the true scope of this invention as claimed.

Figure 2:
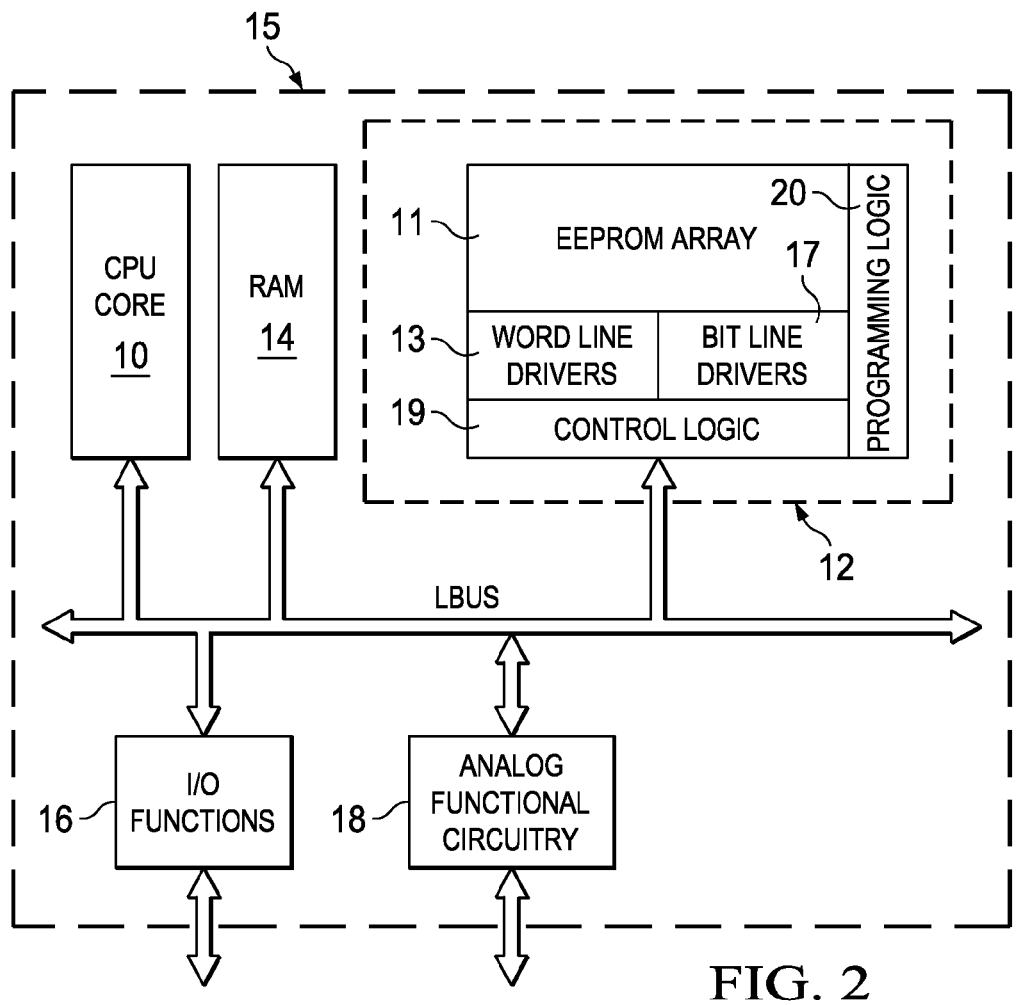
FIG. 2 is an electrical diagram, in block form, of a large-scale integrated circuit including embedded electrically erasable programmable read-only memory (EEPROM) according to an embodiment of the invention.

An example of an embodiment of the invention is illustrated, in functional block diagram form, in FIG. 2. Integrated circuit 15 is a large scale integrated circuit that includes functional circuitry in combination with embedded electrically erasable read-only (EEPROM) memory 12, all formed in a single integrated circuit die or chip. In this example of FIG. 2, the functional circuitry constitutes central processing unit (CPU) core 10, which may be a conventional microprocessor or digital signal processor CPU core as known in the art. Integrated circuit 15 includes such other functions as typical for a large-scale programmable processor, such as read-only memory (RAM) 14, input/output functions 16, and the like, each of which communicate with CPU core 10 via local bus LBUS. Other circuit functions (not shown) as clock circuits, timers, power management circuits, special functionality, control circuits such as direct memory access controllers, and the like are also typically included within large scale integrated circuits such as integrated circuit 15.

Analog functional circuitry 18 is also optionally provided in integrated circuit 15, and includes any one or more of a number of analog functions, such as signal level conversion, bandgap reference voltage generation, reference current generation, voltage regulation, analog input/output functions, and the like. EEPROM cells can be incorporated within analog functional circuitry 18, for example to programmably set or "trim" reference voltage and current levels useful to analog functional circuitry 18.

EEPROM memory 12, as embedded within integrated circuit 15 as shown in FIG. 2, includes EEPROM array 11. As typical in the art, EEPROM array 11 is realized by a relatively large number of EEPROM memory cells arranged in rows and columns. Access to the desired memory cells within EEPROM array 11 is controlled by control logic 19 within EEPROM memory 12. Control logic 19 includes such functionality as address decode circuitry, which in this example selects the desired EEPROM memory cells for reading, programming, or erasing, in response to address signals communicated to EEPROM memory 12 over local bus LBUS, for example from CPU core 10. As will be described in further detail below, that address decode circuitry within control logic 19 will, in programming operations, communicate the selected row to word line drivers 13, and the selected column to bit line drivers 17; in such programming operations, word line drivers 13 and bit line drivers 17 will be controlled by control logic 19 to apply higher voltage levels than applied in read operations, in a manner consistent with embodiments of this invention. In addition, it is contemplated that control logic 19 will also receive input data to be written (i.e., programmed) into selected memory locations of EEPROM array 11 via local bus LBUS, for example from CPU core 10. Other circuitry (not shown) is also incorporated within EEPROM memory 12 and its control logic 19, including sense amplifiers for effecting read operations, and control logic for performing erase operations, including block erase operations for the case in which EEPROM memory 12 is of the "flash" type.

According to embodiments of this invention, EEPROM memory 12 includes programming logic 20. As will be described in detail below, programming logic 20 includes sense and switch circuitry used in carrying out adaptive programming of EEPROM cells within EEPROM array 11, according to embodiments of this invention.

Other functions may also be included within integrated circuit 15, according to embodiments of the invention. These other functions can include memory manager circuitry for controlling the operation of integrated circuit 15 in accessing EEPROM memory 12, for example by reading the contents of EEPROM memory 12 into RAM 14, and the background or batch programming of modifications to these contents back into EEPROM memory 12. This memory manager circuitry can also manage block erase, wear leveling, and other management of EEPROM memory 12, including a "ripple" programming mode in which cells are programmed row-by-row, as described in copending and commonly assigned U.S. patent application Ser. No. 12/627,593, filed 30 Nov. 2009, and incorporated herein by this reference. Built-in-self-test (BIST) or power-on-self-test (POST) functionality is another example of functional circuitry that may be realized within integrated circuit 15.

Figure 1A:
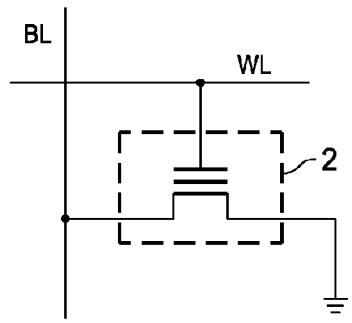
FIG. 1a is an electrical diagram, in schematic form, of a conventional double-polysilicon floating gate memory cell.
Figure 1B:
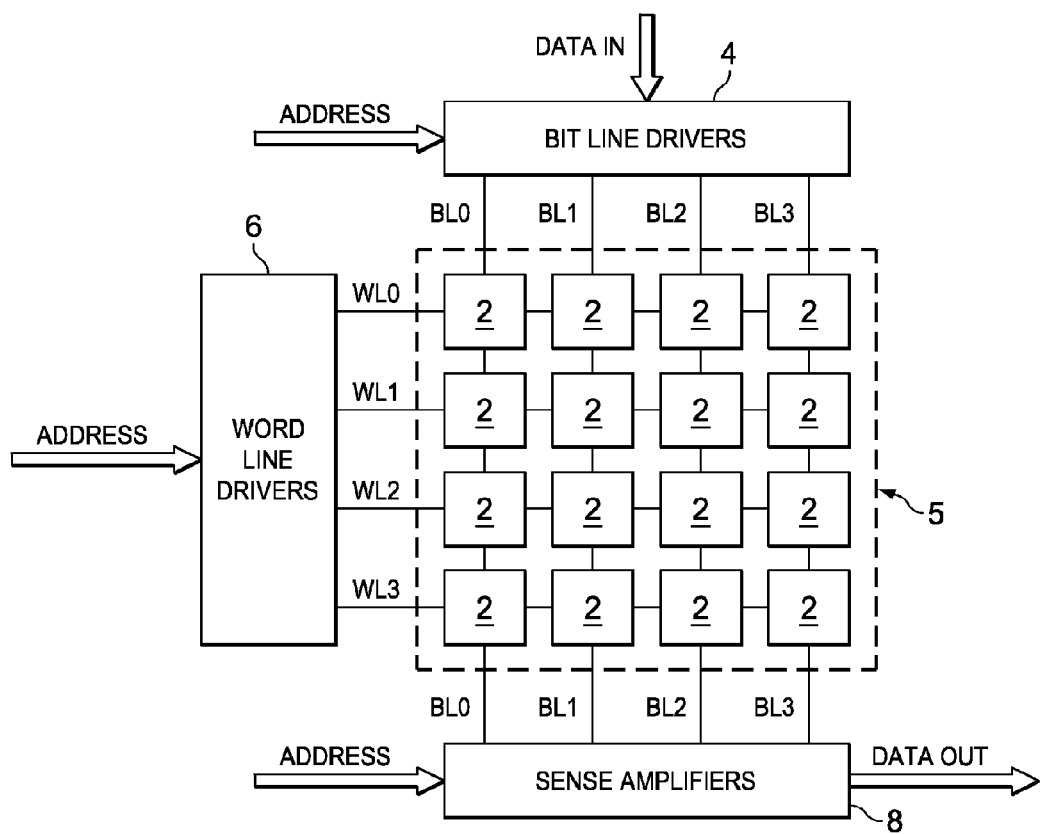
FIG. 1b is an electrical diagram, in block form, of a conventional non-volatile memory.
Figure 3:
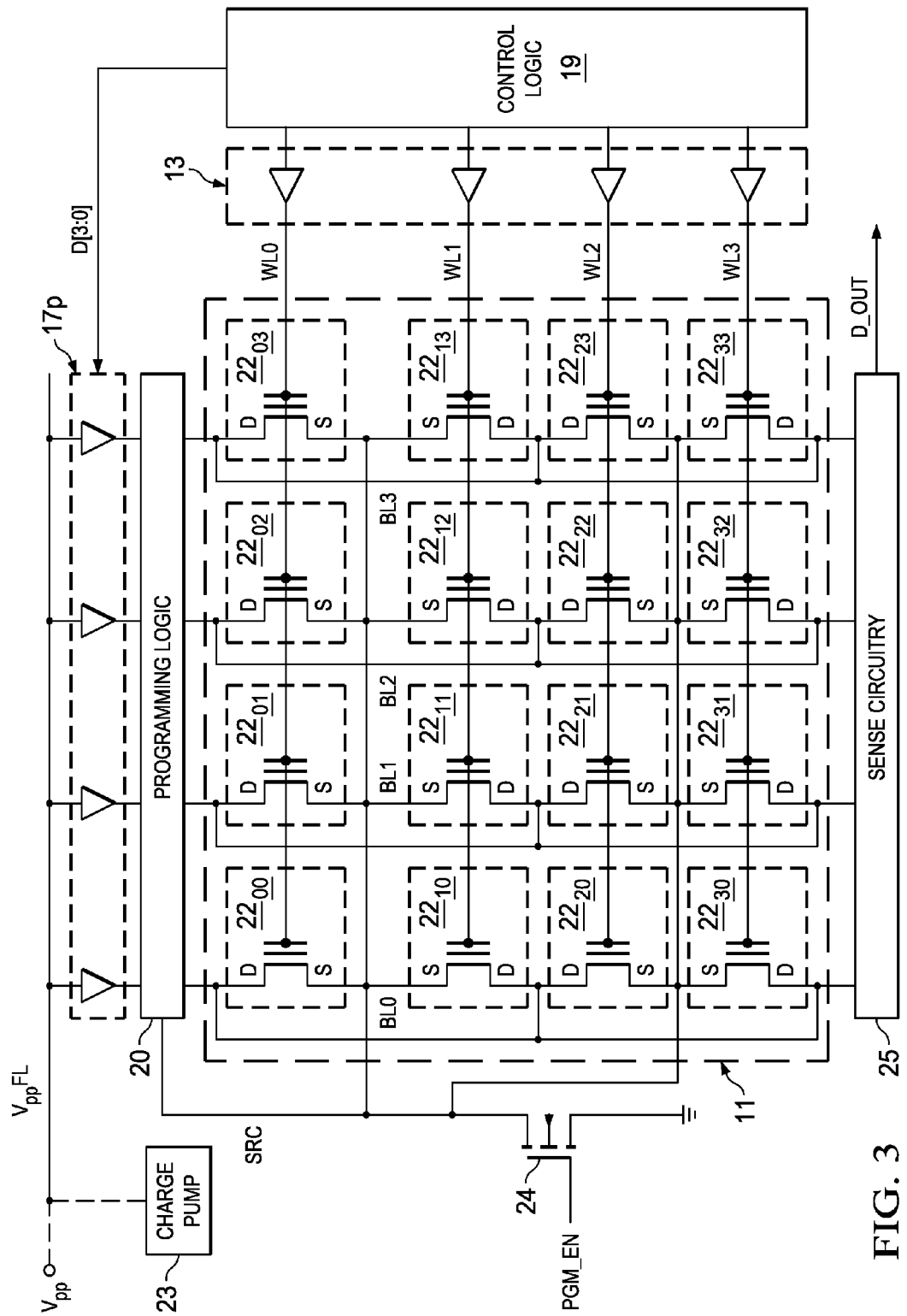
FIG. 3 is an electrical diagram, in block and schematic form, of a memory array and programming circuitry in the integrated circuit of FIG. 2, constructed according to an embodiment of the invention.

FIG. 3 illustrates the construction of portions of EEPROM memory 12, according to an embodiment of the invention in which EEPROM memory cells 22 are arranged in four rows and four columns within EEPROM array 11. This small size of EEPROM array 11 is used in this description for the sake of clarity, it being understood by those skilled in the art that the number of memory cells 22 in a typical EEPROM array 11 can number as many as 2k cells per row, and 512 or more cells per column. According to embodiments of the invention, EEPROM memory cells 22 are realized according to a double-level polysilicon technology, by way of which each memory cell is realized by a floating-gate transistor that also has a control gate electrode, similarly as described above relative to FIG. 1a. As conventional for this construction, the control gate electrode of the floating-gate transistor of each memory cell 22 is connected to one of the word lines WL0 through WL3, the drain (D) of the transistor is connected to one of the bit lines BL0 through BL3, and the source (S) of the transistor is biased to ground via transistor 24 via source line SRC, which connects the sources of the floating-gate transistors of memory cells 22 in common. The gate of transistor 24 is controlled by program enable signal PGM_EN, or by another control signal generated by control logic 19 as usual in EEPROM memories constructed in this manner. For purposes of this description, and as typical in the art, the floating-gate transistors of EEPROM memory cells 22 are n-channel transistors, in which the floating gate electrode is an electrically isolated polysilicon element that is physically disposed under all or part of the control gate electrode (which is realized in a different level of polysilicon from the floating gate electrode), and that overlies the transistor channel region in the conventional manner (i.e., the floating gate electrode is separated from the channel region by a tunnel dielectric film). It is contemplated that any one of the large number of conventional EEPROM memory cell construction approaches known in the art can be used to realize EEPROM memory cells 22 in this embodiment of the invention.

Each of word lines WL0 through WL3 is driven by one of word line drivers 13, under the control of control logic 19. As will be evident from this description, word line drivers 13 are controlled by functions within control logic 19, such functions including a row address decoder, program enable logic that controls the enabling and operation of a programming operation, and, if desired, ripple programming control logic for controlling word line drivers 13 to operate according to the ripple programming approach described in copending U.S. patent application Ser. No. 12/627,593. It is contemplated that those skilled in the art having reference to this specification will be readily able to construct and otherwise realize these functions in control logic 19, by way of combinational or sequential logic arranged in the manner appropriate for a given implementation.

In the generalized arrangement of FIG. 3, sense circuitry 25 is coupled to each of bit lines BL0 through BL3, and is constructed by way of conventional sense amplifier and buffer circuitry; column select circuitry (not shown in FIG. 3) may also be provided within sense circuitry 25, to select one or more of bit lines BL0 through BL3 for connection to a sense amplifier, or to select one or more sense amplifier outputs for communication on data line D_OUT, in read cycles. Circuitry for precharging bit lines BL0 through BL3 is also provided in connection with array 11 of FIG. 3, but is not shown for the sake of clarity.

Circuitry involved in the programming of memory cells 22 is illustrated in FIG. 3, in a generalized sense. One or more programming bit line drivers 17p are coupled to bit lines BL0 through BL3 via programming logic 20, according to embodiments of this invention, the construction of which will be described in further detail below. Each of programming bit line drivers 17p receive programming voltage line $V_{pp}FL$ at their input, and apply this voltage to selected bit lines BL0 through BL3 according to the data being programmed, for example as communicated on data input lines D[3:0] from control logic 19. The programming voltage at line $V_{pp}FL$ may be generated on-chip by charge pump 23, constructed in the conventional manner, or alternatively may be generated by an off-chip programming source and applied to external terminal $V_{pp}$.

As will be described below, one programming bit line driver 17p may be associated with a single bit line BL0 through BL3, or alternatively each programming bit line driver 17p may be associated with a group of bit lines BL0 through BL3, with its programming voltage applied to a subset of that bit line group according to the data value and a portion of the column address. In addition, programming bit line driver 17p may also provide bit line precharge voltages in read operations, if implemented in combination with the appropriate control circuitry and lower precharge voltage source to carry out these multiple operations.

Figure 4A:
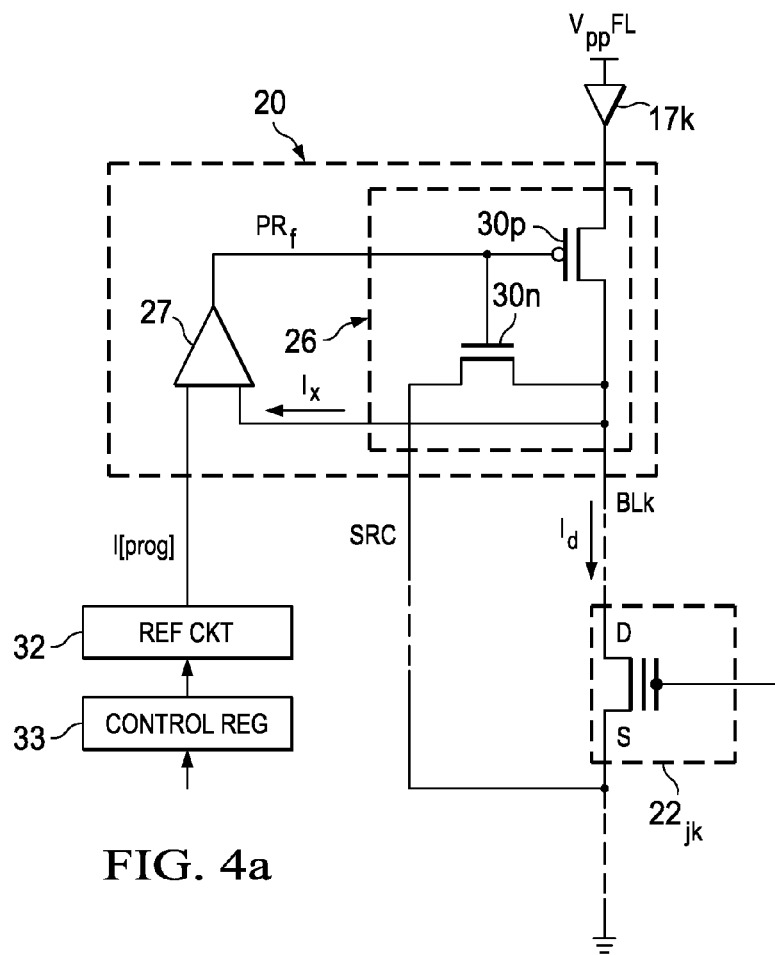
FIGS. 4a through 4c are electrical diagrams, in schematic form, of circuitry for controlling the duration of programming pulses, and the operation of this circuitry, according to embodiments of the invention.

Referring now to FIG. 4a, an instance of programming logic 20 will be described in connection with a corresponding bit line BLk and a selected memory cell $22_{jk}$ in the column associated with that bit line BLk. In this example, memory cell $22_{jk}$ is to be programmed to a "0" level from the erased "1" state (in which memory cell $22_{jk}$ conducts current with a read voltage applied to its control gate). The trapping of hot electrons on the floating gate, as occurs from the programming operation, raises the threshold voltage of the device, and as such a programmed cell (i.e., in the "0" state) will not conduct current upon application of the read voltage at the control gate. Of course, the assigning of data values to the erased and programmed states is arbitrary, and depends on the logic behavior of integrated circuit 15.

FIG. 4a illustrates programming bit line driver 17k for column k of array 11, of which memory cell $22_{jk}$ is a member. In this example, memory cell $22_{jk}$ corresponds to the selected memory cell 22 within column k; the other memory cells 22 in this column k are not shown, for clarity. Programming bit line driver 17k is a conventional non-inverting driver, with an input receiving programming voltage line $V_{pp}FL$; programming bit line driver 17k is constructed to have the capability of driving the desired level of programming current at its output, for the expected programming voltage at line $V_{pp}FL$.

In this example, programming logic 20 is constructed of switching circuit 26 and comparator 27. Switching circuit 26 consists of p-channel MOS transistor 30p and n-channel MOS transistor 30n. The source/drain path of p-channel transistor 30p is connected between the output of programming bit line driver 17k and bit line BLk, while the source/drain path of n-channel transistor 30n is connected between common source line SRC for array 11 (see FIG. 3). The top of bit line BLk (i.e., before connection to memory cells 22) is connected to an input of comparator 27.

Comparator 27, in this embodiment of the invention, is a conventional current comparator, constructed as a differential amplifier, or by way of an integrated operational amplifier. In this embodiment of the invention, comparator 27 directly receives a remainder current $I_x$ from bit line $BL_k$, which is the remainder of the current sourced by programming bit line driver 17k beyond drain current $I_d$ conducted by selected memory cell $22_{jk}$ during programming. A second input of comparator 27 receives reference current I[prog]. Reference current I[prog] is a reference current, generated in this example by reference circuit 32. Reference circuit 32 may be constructed as a conventional reference current and voltage generator, such as based on a bandgap reference circuit or the like.

According to embodiments of this invention, the particular value of reference current I[prog] to which remainder current $I_x$ is compared by comparator 27 corresponds to the desired threshold voltage to which memory cell $22_{jk}$ is to be programmed. It is contemplated that the correlation between various values of reference current I[prog] and the resulting threshold voltage of memory cell 22 can be determined by way of characterization or simulation.

The level of reference current I[prog] may be fixed in the design of integrated circuit, or may be a trimmable current (e.g., analog-trimmed during manufacturing test). In the example shown in FIG. 4a, reference current I[prog] is programmable by way of control register 33, which receives a digital control value from elsewhere in integrated circuit 15, and applies a corresponding control signal to reference circuit 32 to set reference current I[prog] at the desired level. The output of comparator 27 is connected to the gates of p-channel transistor 30p and n-channel transistor 30n.

According to embodiments of this invention, comparator 27 drives a high level at its output if current $I_x$ exceeds reference current I[prog], and drives a low level at its output if reference current I[prog] exceeds current $I_x$. In some embodiments of this invention, reference circuit 32 may not initiate reference current I[prog] at the beginning of a programming cycle, but may delay application of that current to comparator 27, to ensure that comparator 27 initially drives a low logic level at line $PR_f$. As such, the state of switching circuit 26 at the beginning of a programming cycle will be with p-channel transistor 30p on, and n-channel transistor 30n off.

In operation in a general sense, referring to FIG. 3, program enable control signal PGM_EN is driven to an active high level by control logic 19 at such times as a programming cycle is to be active. A row address portion of an address value is decoded by control logic 19, which in turn enables the corresponding word line driver $13_j$ to drive its word line $WL_j$ to a programming voltage; as known in the art, the word line voltage driven in a programming cycle is higher than the word line voltage used during a read cycle, to permit conduction of the desired programming current by the selected memory cells 22. For the case of selected memory cell $22_{jk}$ of FIG. 4a, programming bit line driver 17k will receive the high programming voltage at line $V_{pp}FL$, and drive its output accordingly. In this example, charge pump 23 begins generating this programming voltage, and as such the voltage at line $V_{pp}FL$ begins rising toward its eventual high level and begins sourcing the programming current.

Figure 4B:
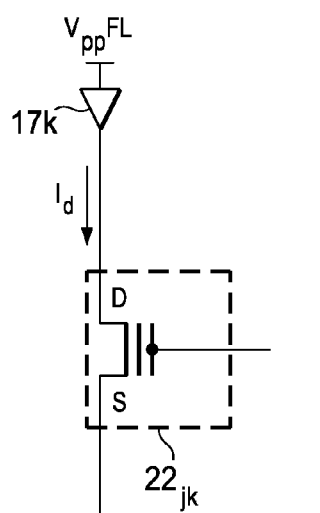

For the case in which selected memory cell $22_{jk}$ is being programmed from a previously erased state (i.e., no trapped carriers on its floating gate), its floating-gate transistor will conduct significant drain current $I_d$ as programming voltage $V_{pp}FL$ is applied, considering that comparator 27 is initially driving a low logic level at its output (transistor 30p is on, and transistor 30n is off, for bit line BLk). As charge pump 23 ramps up toward its eventual level, the bulk of the current sourced by programming bit line driver 17k is thus conducted as drain current $I_d$, with little remainder current $I_x$ being conducted into the input of comparator 27. Accordingly, the output of comparator 27 at line $PR_f$ remains at a low logic level (I[prog]>$I_x$), n-channel transistor 30n remains off, and p-channel transistor 30p remains on. The programming pulse thus continues, with the programming circuit operating essentially in the state illustrated in FIG. 4b.

Figure 4C:
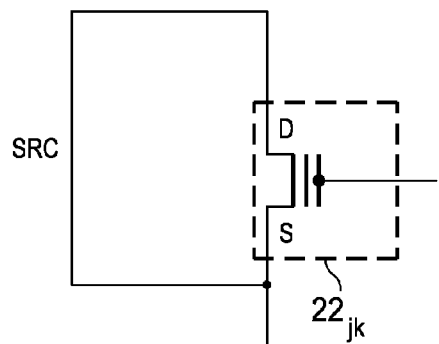

As known in the art, the drain current applied in programming a floating-gate transistor in an EEPROM cell, such as memory cell 22, will decay as the cell begins to reach its programmed state. In the arrangement of FIG. 4a, drain current $I_d$ will thus begin to decay as memory cell $22_{jk}$ becomes programmed, which causes remainder current $I_x$ to increase as programming continues. At the point in time at which remainder current $I_x$ exceeds reference current I[prog], comparator 27 will change its output state at line $PR_f$ from a low level to a high level, in this embodiment of the invention. Upon line $PR_f$ driven high by comparator 27, p-channel transistor 30p will turn off, disconnecting programming bit line driver 17k from bit line BLk, and thus ceasing the programming operation. N-channel transistor 30n will turn on with the high level at line $PR_f$, permitting a conduction path for any residual current and shorting the source and drain of the floating-gate transistor in memory cell $22_{jk}$. In this state, the programming circuit is operating essentially as shown in FIG. 4c. Memory cell $22_{jk}$ is thus programmed at its desired level, and no further programming current is being applied.

According to this embodiment of the invention, the duration of the programming pulse as it is applied to selected memory cell $22_{jk}$ depends on the state of memory cell $22_{jk}$ itself, and the rate at which it programs under the drive current applied by programming bit line driver 17k. The duration of the programming pulse need not be estimated or guessed in advance, nor is a verify operation required in order to determine whether programming is complete. Rather, the drain current behavior of memory cell $22_{jk}$ being programmed itself directly indicates the programmed state of its floating-gate transistor. This behavior is illustrated in FIGS. 5a and 5b, as will now be described.

Figure 5A:
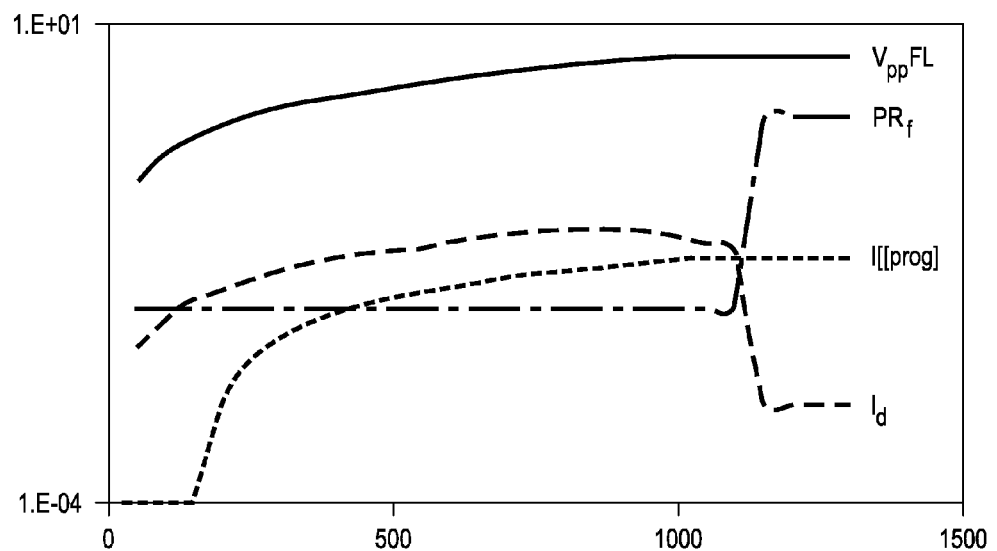
FIGS. 5a and 5b are timing diagrams illustrating the operation of embodiments of this invention in programming an erased bit and a programmed bit, respectively.

FIG. 5a illustrates the behavior of a selected memory cell $22_{jk}$ as it is being programmed from a previously erased state. The programming cycle is initiated at time 0, with charge pump 23 ramping up programming voltage $V_{pp}FL$ applied to programming bit line driver 17k. The appropriate word line WLj has been energized with the appropriate programming cycle control gate voltage applied to selected memory cell $22_{jk}$. The output of comparator 27 at line $PR_f$ is initially at a low level, as described above, and as such drain current $I_d$ through the selected and previously-erased memory cell $22_{jk}$ begins to ramp up accordingly. Reference current I[prog] is ramped up by reference circuit 32 after a short delay (e.g., 150 nsec) to ensure that comparator 27 allows programming (i.e., its output is at a low level) as the cycle begins. As memory cell $22_{jk}$ becomes programmed, drain current $I_d$ conducted by its floating-gate transistor begins to decay, as evident at about 850 nsec in the example of FIG. 5a. This decay in drain current $I_d$ corresponds to an increase in the remainder current $I_x$ (not shown in FIG. 5a) into comparator 27. At about 1100 nsec in the Example of FIG. 5a, that remainder current $I_x$ reaches reference current I[prog], causing comparator 27 to issue a high level at its output on line $V_{pp}FL$. As evident in the example of FIG. 5a, the transition at line $V_{pp}FL$ causes an immediate cessation in drain current $I_d$ into memory cell $22_{jk}$, ending the programming operation.

Figure 5B:
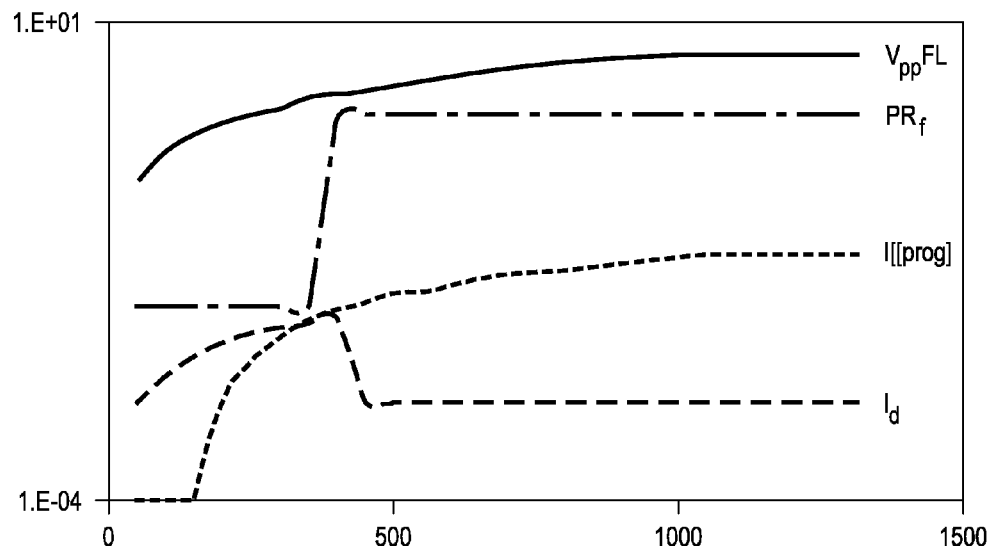

FIG. 5b illustrates the same programming cycle as shown in FIG. 5a, but as applied to a previously-programmed memory cell $22_{jk}$. The programming cycle is initiated in the same manner as described above relative to FIG. 5a. However, in this case, the drain current $I_d$ conducted by memory cell $22_{jk}$ is much lower because the floating-gate transistor is already programmed (i.e., its threshold voltage is much higher than that of an erased cell). As such, the remainder current $I_x$ (not shown in FIG. 5b) exceeds reference current I[prog] at a much earlier time, namely at about 400 nsec in the example of FIG. 5b. At that time, comparator 27 drives a high level onto line $PR_j$, and the programming current applied to memory cell $22_{jk}$ ceases. Typically, this occurs before programming voltage $V_{pp}FL$ is pumped to its full programming level (e.g., at about 2.4 volts rather than the full 4.2 volt programming level).

According to embodiments of this invention, EEPROM programming may be performed without requiring a verify cycle to determine whether the programmed memory cells are in fact programmed to the desired level. The circuitry and method of embodiments of this invention instead directly sense the decay in the drain current applied during programming to the selected cell, and terminate the programming pulse at the desired decay level. In addition, embodiments of this invention eliminate the need for multiple fixed-duration program cycles, as typically applied in program-and-verify cycles to conventional memories. Those multiple cycles can result in over-programming of floating-gate transistors, which spreads the range of programmed cell threshold voltages, and which can also affect long-term reliability.

In addition, because embodiments of this invention prevent over-programming of memory cells, the distribution of threshold voltages of programmed memory cells can be more tightly controlled than according to the conventional program-and-verify techniques. This tighter control results from the direct sensing of programming drain current decay, and the immediate termination of the programming cycle as a result. Accordingly, regardless of the initial states or threshold voltages of a population of cells prior to programming, embodiments of this invention ensure that the distribution of threshold voltages for this population after programming will be tightly controlled. The "compaction" of erased cell threshold voltages, as typically performed in conventional memories to ensure a consistent erased cell threshold voltage distribution, is therefore rendered unnecessary by embodiments of this invention, further improving the efficiency of program and erase operation in flash memories.

The tightly controlled distribution of post-programming threshold voltages for programmed memory cells is especially useful in the operation of multi-level cell (MLC) memories. As known in the art, MLC EEPROM memories store more than two potential data states in each memory cell, by programming cells to multiple threshold voltage sub-ranges within the overall programmability range. The MLC approach greatly increases the data that can be stored within an EEPROM memory; for example, if each cell can be programmed to four possible threshold states, each memory cell can store two bits of data, doubling the memory capacity. The number of data states that can be stored by each memory cell depends strongly on the ability to control the threshold voltages to narrow ranges; as such, embodiments of this invention enhance the ability to implement MLC memories, and in a manner that eases the requirements on sense amplifiers and other circuitry in the memory.

In addition, it is contemplated that embodiments of this invention, for example as illustrated in FIG. 4a, are especially advantageous in accomplishing these benefits. As described above relative to FIG. 4a, comparator 27 directly senses remainder current $I_x$, which increases as the programming drain current $I_d$ decreases. This direct sensing thus avoids the inaccuracies that are inherent in current mirror sense amplifiers, by avoiding the effects of imbalances in the current mirror devices, DC offset, and other such factors. In addition, the circuit of FIG. 4a is self-compensating in that the effect of variables such as temperature, power supply voltage, process variations, and the like, on the programmability of the memory cells and on the drive of the bit line drivers do not affect the eventual threshold voltage of the programmed cell. In other words, the rate at which the memory cell is programmed is not a factor in the threshold voltage to which it is eventually programmed, according to embodiments of this invention. In addition, embodiments of this invention enable changing of the programmed cell threshold voltage simply by programming or otherwise modulating the level of reference current I[prog], without requiring that the programming current applied by programming bit line drivers 17 be changed.

Furthermore, the embodiment of this invention described above in connection with FIG. 4a provides active feedback to the programming operation, by way of the direct application of remainder current $I_x$ to comparator 27. This "analog" feedback control of the programming current is advantageous relative to conventional programming control circuits involving a latched control state that remains set once it is set, remaining so until actively reset. Programming logic 20 of the embodiment of FIG. 4a is much more responsive to changes in programming conditions, than is the more complicated circuitry of conventional programmable memories.

Embodiments of this invention are also compatible with modern "fast" programming schemes in which memory cells within a selected row are sequentially programmed within a single row select cycle. In such programming schemes, a row address portion of the memory address selects the row, or "page", of the memory array to be programmed, and multiple column address values, corresponding to bits within that row that are to be programmed, are presented to the memory without requiring the row address to be presented again. In conventional "fast" programming, the programming voltage applied to the word line is removed as the next column address is presented. A "ripple" programming mode is described in copending and commonly assigned U.S. patent application Ser. No. 12/627,593, incorporated herein by this reference, in which the word line can remain energized at its programming voltage as the column address changes. The adaptive programming approach according to embodiments of this invention can be used in connection with each of these programming modes, as will now be described with reference to FIG. 6.

Figure 6:
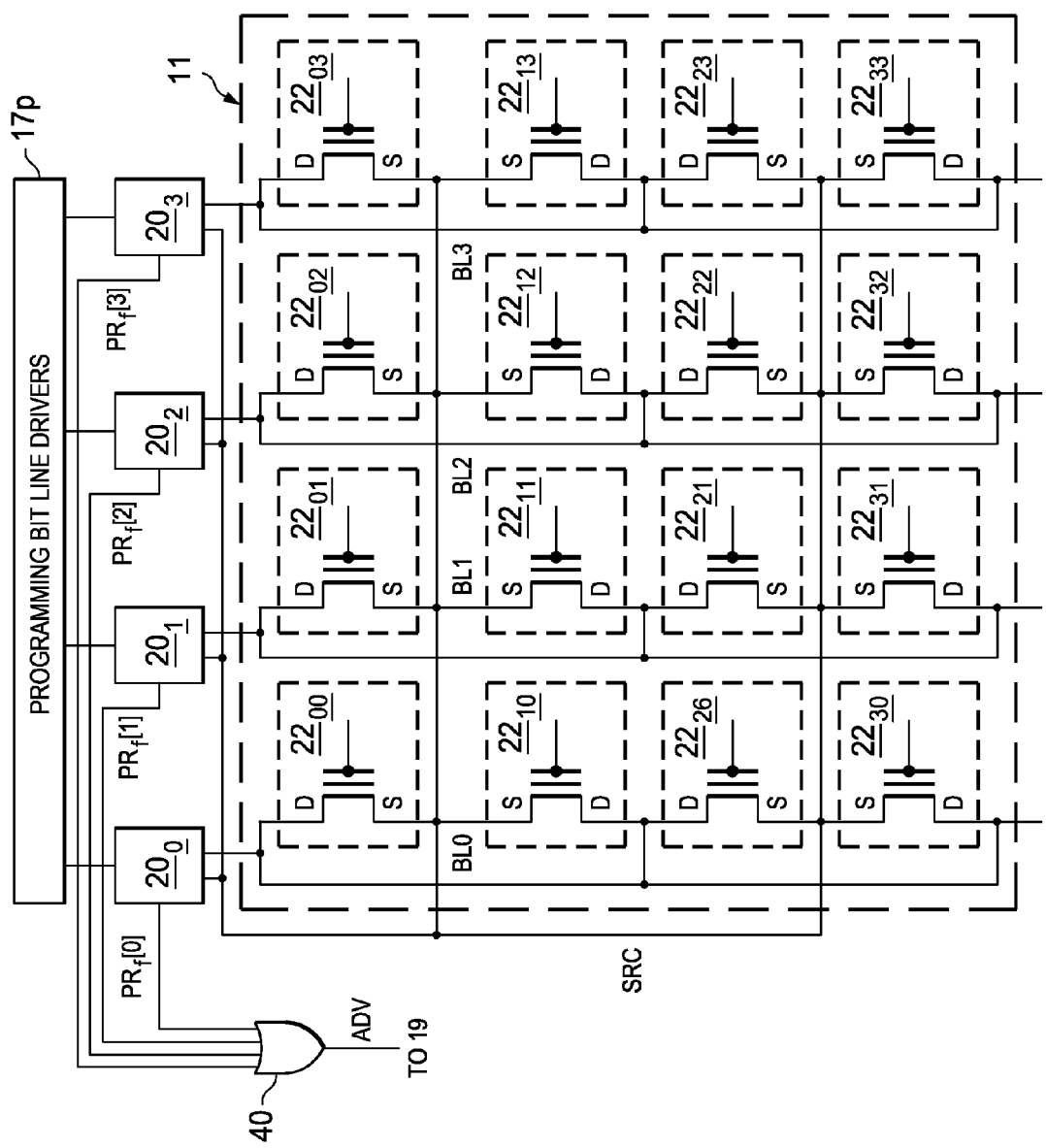
FIG. 6 is an electrical diagram, in block and schematic form, of a memory array and programming circuitry in the integrated circuit of FIG. 2, constructed according to another embodiment of the invention.

FIG. 6 illustrates an example of memory array 11, as described above, in which each column of memory cells 22 is associated with its own programming logic 20. Reference circuit 32 (not shown) forwards reference current I[prog] to each of these circuits $20_0$ through $20_3$. In this example, each of circuits $20_0$ through $20_3$ for the four columns of array 11 forwards a signal from its comparator 27 output, on lines $PR_j[0]$ through $PR_j[3]$, respectively, to logic circuit 40. Logic circuit 40 generates an advance signal on line ADV based on the inputs it receives from lines $PR_j[0]$ through $PR_j[3]$; line ADV is forwarded to control logic 19.

In the operation of this example, it is contemplated that comparators 27 in circuits $20_0$ through $20_3$ each generate a low level on their respective lines $PR_j[0]$ through $PR_j[3]$ if a cell in their corresponding column is not being programmed, and also at the beginning of a programming cycle to a cell in its column (see FIGS. 5a and 5b). Logic circuit 40 is thus constructed as a four-input OR gate in this example. To program multiple cells 22 within a single row, according to a fast or ripple programming mode as described above, the row containing the cells to be programmed is first selected and its corresponding word line energized to the programming voltage, as described above. Depending upon the data value to be programmed, a first cell 22 in this row is selected and programming begins, under the control of control logic 19 (not shown). Upon that cell 22 in one of the columns of array 11 in the selected row attaining the desired programmed level, comparator 27 in its programming logic $20_k$ drives its output, at corresponding line $PR_f[k]$, to a high level, terminating the programming operation as described above. This high level at line $PR_f[k]$ causes logic circuit 40 to issue a high level on line ADV at its output, indicating that cell 22 has been programmed to the desired threshold level. In response to that signal, control logic 19 can advance to the next cell 22 to be programmed within the currently selected row, and the process repeats.

In this manner, programming sense and logic circuits 20 can further facilitate the fast or ripple programming modes, by terminating the program operation for each memory cell 22 upon sensing that the desired floating-gate threshold voltage has been attained, and then indicating that programming can be advanced to the next cell 22 to be programmed. Alternatively, logic circuit 40 can be omitted, and the duration of the programming pulse to a given column can be fixed, even in the fast or ripple programming mode. In either case, according to embodiments of this invention, over-programming of cells 22 is avoided, while providing a more efficient programming operation.

A known operation in the management and use of flash memories is a "pre-condition" prior to block erasure. In such a precondition operation, all cells in the block to be erased are first programmed to a known state, following which the entire block is then erased in the well-known "flash" manner. The preconditioning of the cells in the block by the programming operation ensures that all cells in the erased block are at about the same threshold voltage and state. This avoids having some cells (e.g., previously erased cells) "over-erased" by the block erase operation, as those cells will require additional programming to arrive at the desired threshold voltage.

Figure 7A:
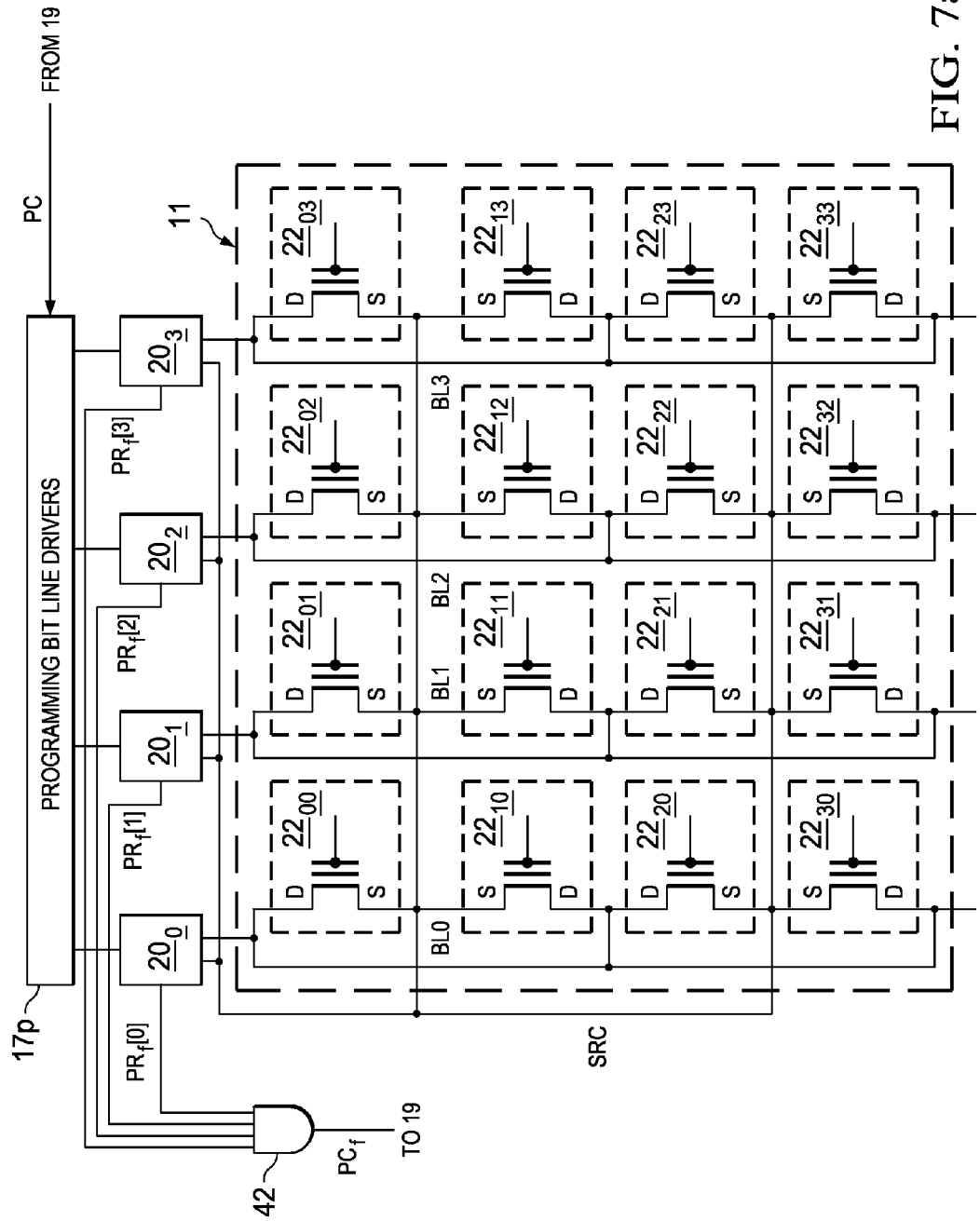
FIG. 7a is an electrical diagram, in block and schematic form, of a memory array and programming circuitry in the integrated circuit of FIG. 2, constructed according to another embodiment of the invention.
Figure 7B:
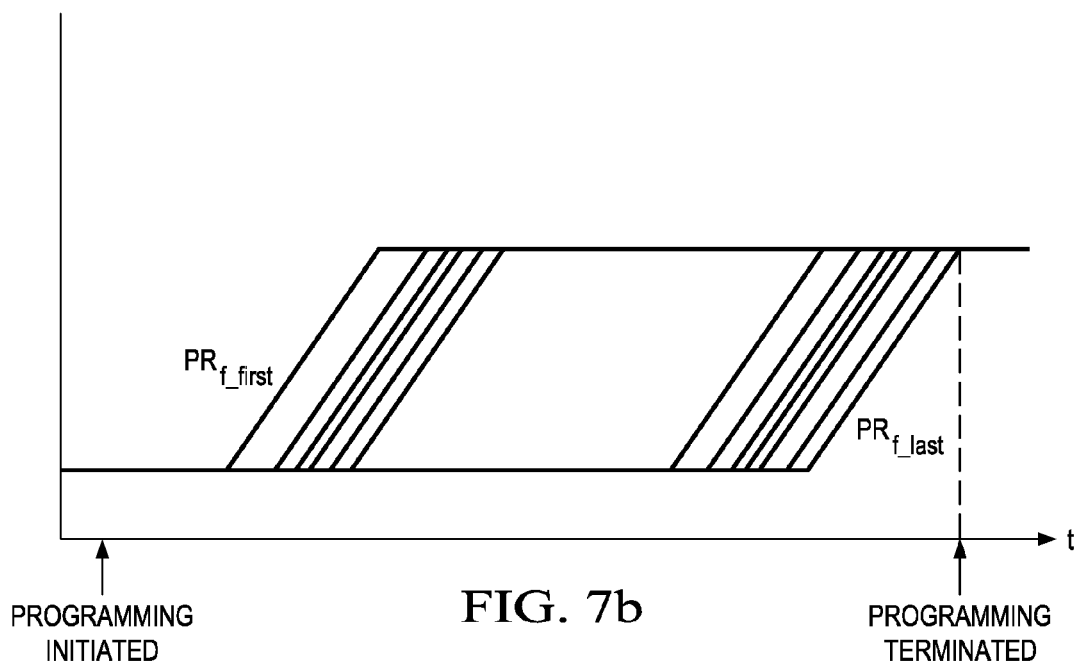
FIG. 7b is a timing diagram illustrating the operation of the memory of FIG. 6 in a preconditioning operation, according to an embodiment of the invention.

Referring to FIGS. 7a and 7b, the implementation of an embodiment of the invention in connection with a pre-conditioning operation will now be described, by way of the example of memory array 11 of four rows and four columns. In this embodiment of the invention, programming bit line drivers 17p receive precondition control signal PC from control logic 19, to execute the precondition programming. Similarly as discussed above relative to FIG. 6, each of lines $PR_f[0]$ through $PR_f[3]$ at the output of comparator 27 in each of programming sense and logic circuits $20_0$ through $20_3$, respectively, are forwarded to a logic function, in this case to an input of AND gate 42. AND gate 42 issues a high logic level at its output, at line $PC_f$, in response to all of lines $PR_f[0]$ through $PR_f[3]$ being at a high logic level. Line $PC_f$ is forwarded to control logic 19, indicating the end of the precondition operation.

In operation, preconditioning is applied to all cells 22 in a selected row of array 11, upon the energizing of precondition control signal PC by control logic 19, in combination with the generation or receipt of a row address indicating the selected row, and the resulting energizing of the corresponding word line. This precondition control signal PC may be issued automatically by control logic 19 upon the invoking of a block erase operation, or it may be specifically invoked by way of control signals applied to EEPROM memory 12. In response to precondition control signal PC, each of programming bit line drivers 17p applies the high programming voltage $V_{pp}FL$ and the corresponding programming current to a memory cell 22 in its associated column, and in the selected row of array 11. The preconditioning programming thus simultaneously programs one cell 22 in every column of the selected row.

Each cell 22 receiving the preconditioning programming current will, as known in the art, program at its own rate, and programming logic $20_k$ associated with each column k will sense the rate at which its cell 22 in the selected row is programmed. As described above, upon the cell 22 becoming programmed to the desired threshold voltage, as indicated by its drain current $I_d$ decaying and the remainder current $I_x$ exceeding the reference current I[prog], then comparator 27 in the associated programming logic $20_k$ will issue a high logic level at its corresponding line $PR_{f\_k}$, which disconnects the current output by its programming bit line driver 17p to the selected cell 22. It is contemplated that reference current I[prog] for the preconditioning operation may be different from that used in conventional data state programming. In addition, the high level on its corresponding line $PR_{f\_k}$ will be forwarded to AND gate 42. FIG. 7b illustrates an example of the transitions of logic states at lines $PR_{f\_k}$ for a row of memory cells 22 (in this case, from a row having more than the four cells 22 shown in FIG. 7a). As evident from FIG. 7b, programming is initiated at a point in time, after which transitions begin to appear at lines $PR_{f\_k}$, beginning with the first transition seen on line $PR_{f\_1st}$, and then continuing for other cells 22 and columns in the selected row. Some cells 22 may already be programmed at the time of preconditioning; those cells 22 will of course reach the preconditioning threshold rapidly, while those cells 22 that were in the erased state will require more programming time. Upon the last line $PR_{f\_last}$ making its transition, as shown in FIG. 7b, control signal $PC_f$ will be issued by gate 42, which causes control logic 19 to terminate the preconditioning programming operation for that row. Additional rows of cells 22 may then be preconditioned in the same manner, until the entire block is preconditioned to the desired state, after which the block erase operation can be performed in the conventional manner.

As a result of this embodiment of the invention, the preconditioning operation can be done rapidly and efficiently, with a single programming pulse applied in parallel to multiple columns, while still resulting in a tight distribution of preconditioned threshold voltages, considering that each cell 22 being programmed itself provides direct feedback that terminates the programming operation being applied to it. The variation in erased cell threshold voltage is thus reduced, because of the reduced variation in cell states prior to the block erase.

Embodiments of this invention are compatible with "parallel" programming of multiple bits within a row, or "page", of the memory array as is desirable in modern flash memories. Many memory architectures include columns that are arranged into groups, each group sharing circuitry such as a sense amplifier, or programming bit line driver. In such an arrangement, a given column address value will select one and only one column within each group; as a result, a single memory address may return a byte, word, or double word of data within a single cycle. Embodiments of this invention are useful in facilitating parallel programming of data in such architectures, as will now be described in connection with FIG. 8.

Figure 8:
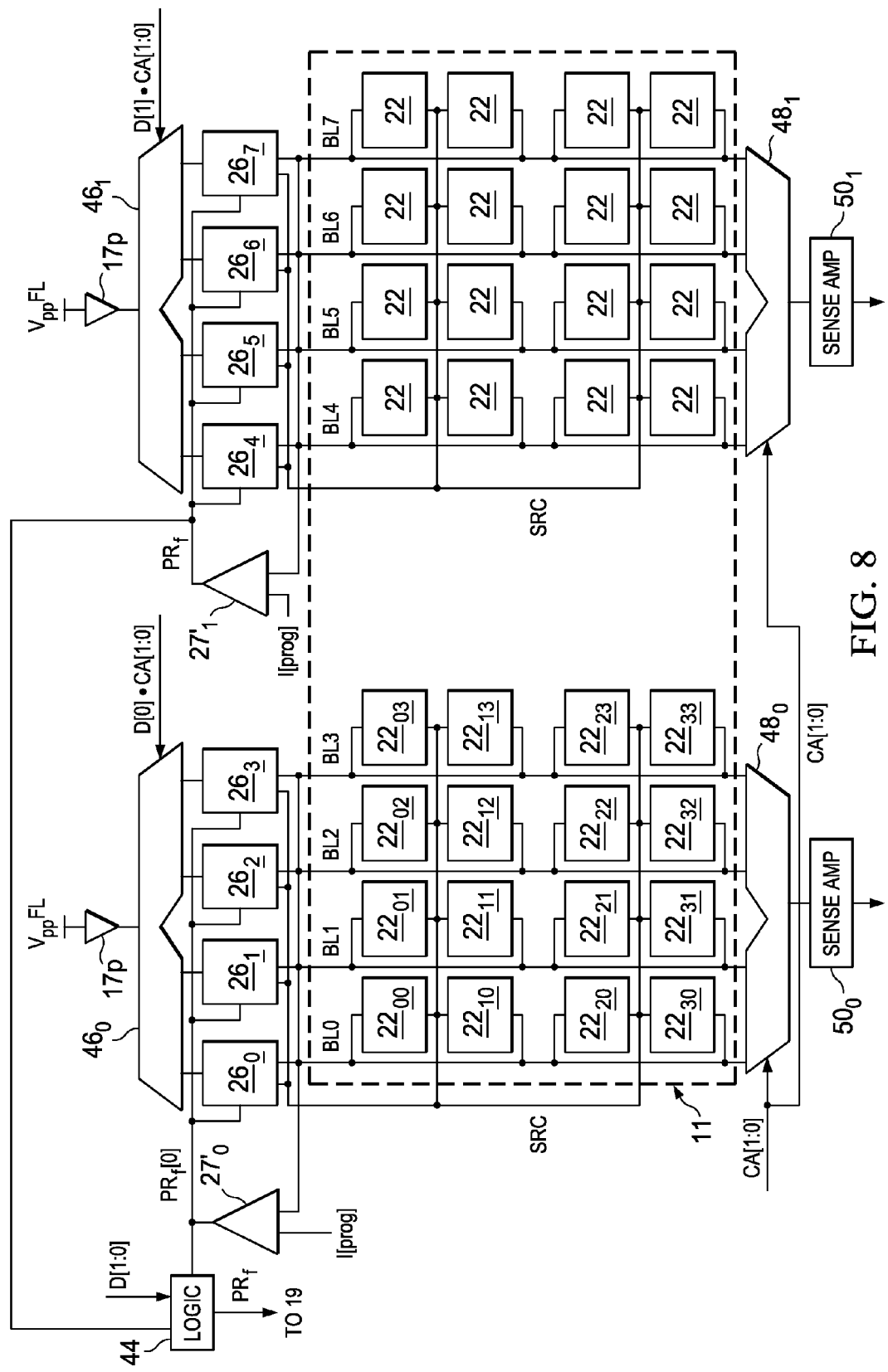
FIG. 8 is an electrical diagram, in block and schematic form, of a memory array and programming circuitry in the integrated circuit of FIG. 2, constructed according to another embodiment of the invention.

In the simplified example of FIG. 8, memory array 11 includes memory cells 22 arranged in four rows and eight columns. Columns 0 through 3 share sense amplifier $50_0$ and programming bit line driver $17_0$, and columns 4 through 7 share sense amplifier $50_1$ and programming bit line driver $17_1$. For purposes of a read operation, multiplexer $48_0$ couples one of bit lines BL0 through BL3 to sense amplifier $50_0$, and multiplexer $48_1$ couples one of bit lines BL4 through BL7 to sense amplifier $50_1$, both in response to column address bits CA[1:0]. Similarly, on the programming side, multiplexer $46_0$ couples programming bit line driver $17_0$ to one of bit lines BL0 through BL3 via corresponding switch circuits $26_0$ through $26_3$, and multiplexer $46_1$ couples programming bit line driver $17_1$ to one of bit lines BL3 through B17, via corresponding switch circuits $26_4$ through $26_7$, both responsive to column address bits CA[1:0], as combined with input data values D[0], D[1] respectively. As such, in this example, the same memory address value will simultaneously access (for either a read, or for programming) one column in each of the two groups; in the case of programming, whether programming in fact takes place depends on the data state for that bit.

Of course, variations in this particular architecture will be recognized by those skilled in the art. For example, each column (i.e., bit line) may be associated with its own bit line driver, with a control signal based on the address determining which of the group of bit lines drivers is to be enabled within a given cycle. In addition, the number of columns sharing a sense amplifier may vary, depending on the size of the memory and the data width being accessed within a cycle. It is contemplated that those skilled in the art having reference to this specification will recognize and be readily able to apply embodiments of this invention to such similar architectures, as desired.

In the embodiment of the invention shown in FIG. 8, an instance of programming logic 20 is provided for each group of columns. In this example, columns 0 through 3 share a single comparator $27'_0$, which receives reference current I[prog] from reference circuit 32 (not shown), and the common source line from array 11, specifically from cells $22_{00}$ through $22_{33}$ in this group of columns 0 through 3. An instance of switch circuit 26 is provided for each column, with switch circuits $26_0$ through $26_3$ associated with columns 0 through 3, respectively. For programming control according to embodiments of this invention, bit lines BL0 through BL3 are connected in common to an input of comparator $27'_0$, considering that only one column will be accessed in any given cycle. Conversely, comparator $27'_0$ issues its control signal on line PR$_f$[0] to each of switch circuits $26_0$ through $26_3$. Similarly, comparator $27'_1$ is shared by switch circuits $26_4$ through $26_7$, for columns 4 through 7. Comparator $27'_1$ receives bit lines BL4 through BL7 at a common node, and issues its control signal on line PR$_f$[1] to each of switch circuits $26_4$ through $26_7$. Considering the addressing scheme described above, in which one column in each group (i.e., one of columns 0 through 3, and one of columns 4 through 7) is selected in each programming cycle, the construction of programming logic 20 for each selected column corresponds to that described above in connection with FIGS. 4a through 4c.

According to this embodiment of the invention, simultaneous programming of two memory cells 22, one in columns 0 through 3 of the selected row and one in columns 4 through 7 of the selected row, can be performed by way of a single programming pulse. Upon the selected cell in one group of columns becoming sufficiently programmed, as determined by its comparator 27', the control signal on corresponding line PR$_f$ is issued by that comparator 27' to the switch circuit $26_k$ of the selected column, terminating the programming to the selected cell in that column. Programming can continue to other selected cells in other column groups, while still terminating the programming pulse where appropriate. A fixed programming pulse can be applied to the selected cells, without risk of over-programming due to the operation of comparators 27' and the corresponding switches 26 for the selected columns, as described above.

Optionally, logic circuit 44 can be provided within the memory to determine when all selected cells have completed programming. Logic circuit 44 receives lines PR$_f$[0], PR$_f$[1] from comparators $27'_0$, $27'_1$, respectively, as well as the data values for the selected cells in these two groups, on lines D[1:0]. Logic circuit 44 applies the data states on lines D[1:0] to the state of lines PR$_f$[0], PR$_f$[1], to determine when all cells that are to be programmed have completed programming. Upon that determination (i.e., lines PR$_f$[0], PR$_f$[1] at a high level for all cells 22 that are to be programmed in the current cycle), logic circuit issues a control signal PR$_f$ to control logic 19, indicating completion of this programming cycle. As such, embodiments of this invention are well-suited and compatible for use in parallel programming operations.

A comparison of FIGS. 5a and 5b illustrates another important advantage of embodiments of this invention, which is specifically important in the parallel programming implementation described above. According to this invention, memory cells 22 are effectively "self-masking", in that their existing data state serves as a mask to additional programming. Memory cells that are already programmed are not further programmed, according to embodiments of this invention, without requiring a read cycle to determine whether a cell has been previously programmed, and without requiring external circuitry for blocking further programming cycles. This self-masking effect thus not only shortens the overall programming time, but also reduces the circuitry necessary for implementation of the memory; conventional memory circuits, in contrast, require the performing of a read operation and the application of a data mask to prevent programming of cells that are already programmed.

Figure 9:
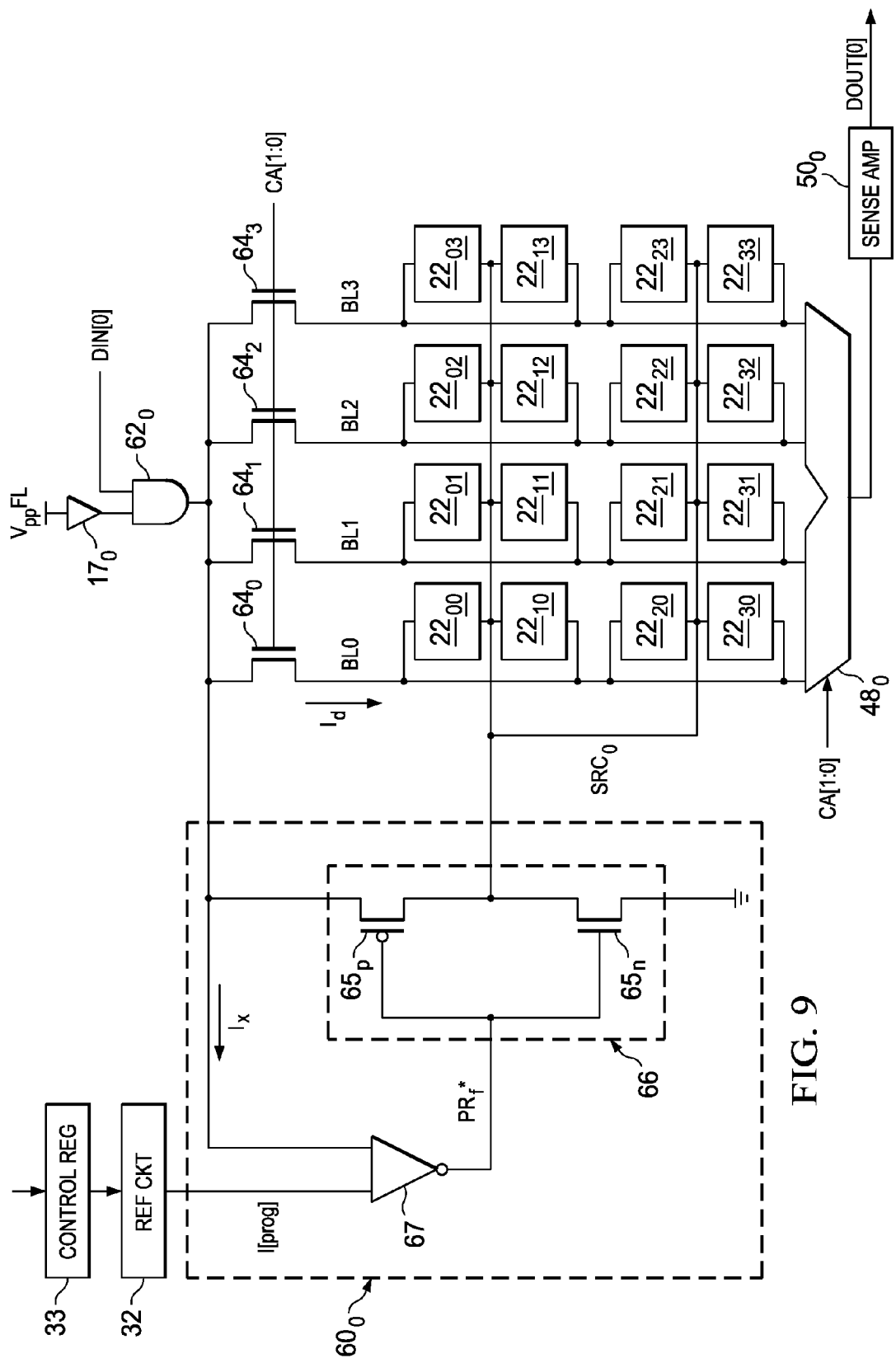
FIG. 9 is an electrical diagram, in block and schematic form, of a memory array and programming circuitry in the integrated circuit of FIG. 2, constructed according to another embodiment of the invention.

FIG. 9 illustrates a portion of a memory constructed according to an example of another embodiment of this invention. The portion of memory array 11 shown in FIG. 9 includes four columns of memory cells 22 that are associated with a single bit (bit 0 in this case) of the input and output data word. Memory array 11 will, of course, include additional columns that are similarly grouped, with each group associated with another bit of the input/output data word; in some cases, the bit width of the input/output data word may be as high as 128 bits, if not even higher in some cases. The four columns of memory cells 22 shown in FIG. 9 share sense amplifier $50_0$ and programming bit line driver $17_0$. As in the arrangement of FIG. 8 described above, multiplexer $48_0$ couples the one of bit lines BL0 through BL3 indicated by column address bits CA[1:0] to sense amplifier $50_0$ in read operations. In programming operations, programming bit line driver $17_0$ is gated by AND gate $62_0$ according to input data bit DIN[0], and applied to a single one of bit lines BL0 through BL3 via pass devices $64_0$ through $64_3$, also in response to column address bits CA[1:0]. Word line drivers 13 (FIG. 3) will drive one word line (not shown in FIG. 9) active in response to the row address, in both read and programming cycles. As such, according to this embodiment of the invention, a single memory cell 22 in the portion of memory array 11 is selected in any given read or programming cycle. Conversely, each memory address value selects no more than one memory cell 22 in the four columns shown in FIG. 9, with that selected memory cell 22 being associated with a single input/output bit.

In this embodiment of the invention, an instance of programming logic 60 is provided for each input/output bit (i.e., each group of columns associated with a single bit of the input data word). In this example, only the memory cells 22 in columns 0 through 3 are associated with input data bit DIN[0], as mentioned above; other columns in memory array 11 are associated with other input data bits. Memory cells 22 in columns 0 through 3 are constructed as floating-gate transistors in this example, as described above, each of which has a drain node connected to its corresponding bit line BL0 through BL3. According to this embodiment of the invention, these memory cells 22 in columns 0 through 3 each have their source node connected to common source line $SRC_0$. Memory cells 22 associated with other input data bits do not have their source nodes connected to source line $SRC_0$; rather, the memory cells 22 grouped with a given input data bit DIN[x] have their source nodes connected in common to an associated source line $SRC_x$. According to the arrangement in this embodiment of the invention, therefore, in a given programming operation, the programming current conducted by each source line $SRC_x$ will only be that conducted by the single memory cell 22 associated with the current memory address and with the associated input data line DIN [x].

Programming logic $60_0$ for input data bit DIN[0] includes a single instance of switch circuit 66, which is shared among columns 0 through 3 associated with input data bit DIN[0]. Switch circuit 66 includes n-channel MOS transistor 65$n$, which has its drain connected to source line $SRC_0$ and its source at ground, and p-channel MOS transistor 65$p$, which has its drain connected to source line $SRC_0$ and its source connected to receive the programming voltage driven by programming bit line driver $17_0$, in this case from the output of AND gate 62. The source node of transistor 65$p$ in switch circuit 66 is connected to an input of comparator 67 in programming logic $60_0$. The other input to comparator 67 constitutes reference current I[prog] generated by reference circuit 32, which as described above may be a programmable reference circuit, with its output current determined by the contents of control register 33. Comparator 67 is "inverting" relative to embodiments of the invention described above, in that it presents a logic "0" output responsive to reference current I[prog] being higher than the current received at its other input. The output of comparator 67 on line $PR_f^*$ is connected to the gates of transistors 65$p$, 65$n$ in switch circuit 66.

As mentioned above, programming logic $60_0$ shown in FIG. 9 serves those columns associated with input data bit DIN[0]. A similarly constructed instance of programming logic $60_x$ is provided for those columns associated with each other input data bit DIN[x].

In operation, programming logic $60_0$ has no effect in read cycles. Either another device (not shown) couples source line $SRC_0$ to ground in read cycles, or comparator 67 is reset to ensure that transistor 66$n$ is turned on in read cycles, providing source node bias to memory cells 22. In programming cycles in which one of memory cells 22 in columns 0 through 3 of memory array 11 is to be programmed to a "1" state, data input line DIN[0] will be at a "1" level, causing AND gate $62_0$ to pass the output of programming bit line driver $17_0$ to the one of bit lines BL0 through BL3 selected by its corresponding pass transistor $64_0$ through $64_3$, responsive to column address bits CA[1:0]. Programming drain current $I_d$ is then conducted by the one of memory cells 22 in that selected column, and in the selected row. To the extent that excess current is driven by programming bit line driver $17_0$ beyond the drain current $I_d$ conducted by the selected memory cell 22, that remainder current $I_x$ is applied to the corresponding input of comparator 67.

As mentioned above, comparator 67 drives a low level onto line $PR_f^*$ at its output so long as remainder current $I_x$ exceeds reference current I[prog]. This initializes transistor 65$n$ in the on state, and transistor 65$p$ in the off state. To ensure that programming of the selected memory cell 22 occurs (i.e., is not locked out by transistor 65$n$ beginning the cycle in an off state), reference circuit 32 delays the initiation of reference current I[prog] for a selected time period after the initiation of programming current $I_d$. As described above, as the selected memory cell 22 is programmed to its "1" state, the drain current $I_d$ that it conducts begins to flatten (see FIGS. 5$a$ and 5$b$); as less drain current $I_d$ is conducted, remainder current $I_x$ into comparator 67 increases. Upon remainder current $I_x$ reaching and exceeding reference current I[prog], the output of comparator 67 changes state from a "1" level to a "0" level. That "0" level on line $PR_f^*$ turns on transistor 65$p$ and turns off transistor 65$n$. This disconnects source line $SRC_o$ from ground, and connects source line $SRC_0$ to the programming voltage driven by programming bit line driver $17_0$. In this state, the drain and the source of the selected memory cell 22 are connected together, terminating the programming operation. Optionally, line $PR_f^*$ may be coupled to logic circuitry (not shown in FIG. 9) as described above, to indicate to control circuitry that programming of the selected memory cell 22 associated with input data bit DIN[0] has ended.

According to this embodiment of the invention, the programming of the selected memory cell 22 is adaptively controlled, as in the embodiments of the invention described previously. Termination of the programming mechanism is determined by the response of the memory cell itself without requiring a verify operation, improving the efficiency of the programming operation, preventing over-programming, and resulting in more uniform programmed levels among all memory cells in the array. As described above, those memory cells that are already programmed are thus "self-masked" from additional programming, without requiring a read or verify cycle to make that determination. In contrast to the previously-described embodiments of the invention, programming logic $60_0$ of this embodiment of the invention applies such control by disconnecting the source of the selected memory cell 22 from ground, rather than by disconnecting the drain of the selected memory cell from the programming current. Because the source nodes of memory cells in multiple columns are connected in common, the arrangement of FIG. 9 is thus best-suited for designs in which one bit per input/output is being programmed at a time, and in which the source nodes are segmented according to input/output assignment. If such is the case, the arrangement of this embodiment of the invention provides the additional benefit that multiple columns can be controlled using a single switch circuit 66, rather than requiring a switch circuit for each column as described above.

Figure 10:
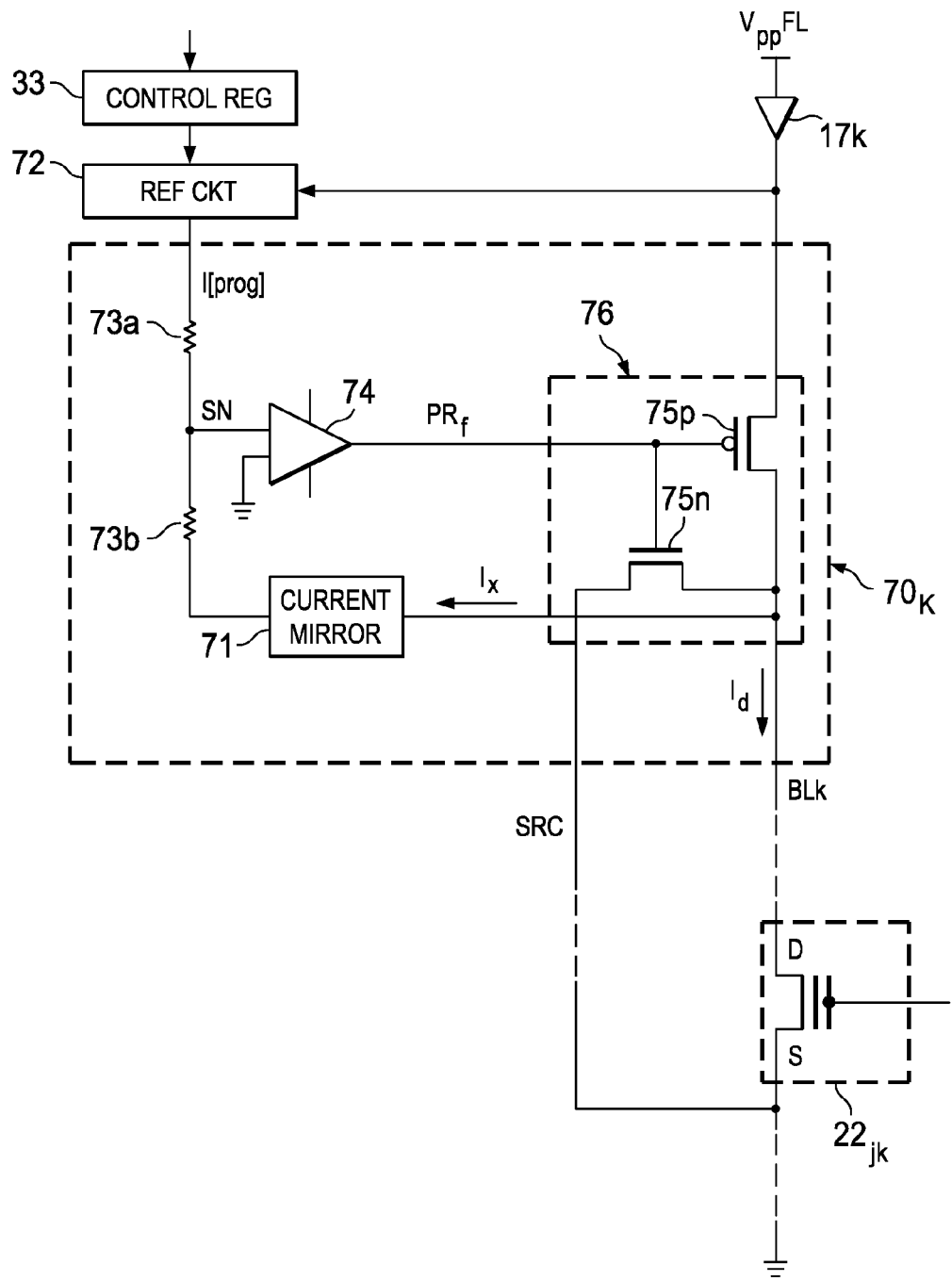
FIG. 10 is an electrical diagram, in schematic form, of programming circuitry in the integrated circuit of FIG. 2, constructed according to another embodiment of the invention.

In each of the embodiments of the invention described above, reference current I[prog] is delayed from the application of the programming current. This delay avoids the potential race condition in which reference current I[prog] is applied to comparators 27, 67 prior to remainder current $I_x$, which would set the output of comparators 27, 67 to disable programming from the very start of the programming cycle (placing memory cell 22 into the state shown in FIG. 4$c$). This interlocked timing of the programming and reference current may be cumbersome from a design and layout standpoint, particularly when considering expected variations in voltage, temperature, and manufacturing parameters. Referring now to FIG. 10, an embodiment of this invention will now be described in which this potential race condition is avoided without requiring separate and independent timing of the programming and reference currents.

FIG. 10 illustrates the construction of programming logic $70_k$ in association with memory cell $22_{jk}$ in memory array 11. Programming logic $70_k$ according to this embodiment of the invention may be implemented in memory array 11, relative to its columns and input/output lines, in each of the arrangements described above in connection with FIGS. 3, 6, and 8. In addition, as will become evident from this description, programming logic $70_k$ will be described in an implementation in which the drain node of the memory cell being programmed will be controllably connected or disconnected from the programming current; it is contemplated that this embodiment of the invention may also be realized in similar manner to that described above relative to FIG. 9, in which the source node of the memory cell being programmed is controllably connected or disconnected from ground according to the programmed state. It is contemplated that those skilled in the art having reference to this specification will be readily able to implement this embodiment of the invention according to any of these variations, and alternatives thereto, without undue experimentation.

In the arrangement shown in FIG. 10, programming logic $70_k$ includes switch circuit 76, which includes p-channel MOS transistor 75p with its source coupled to the output of programming bit line driver 17k and its drain connected to bit line BLk, which in turn is connected to the drain of the selected memory cell 22 being programmed. Switch circuit 76 also includes n-channel MOS transistor 75n, which has its drain connected to the drain of transistor 75p, and its source connected to source node SRC at the source of memory cell $22_{jk}$ and thus at ground during programming cycles. The gates of transistors 75p, 75n are connected together at line $PR_f$, which is driven from the output of amplifier 74 in this embodiment of the invention.

In this embodiment of the invention, reference circuit 72 generates reference current I[prog] based on the voltage driven from programming bit line driver 17k. The relationship between the output voltage of programming bit line driver 17k and reference current I[prog] can be programmably defined, for example by control register 33 in this embodiment of the invention. Reference current I[prog] is applied to summing node SN via resistor 73a. Bit line BLk is connected to current mirror 71, which is a conventional current mirror circuit for producing a current at a desired multiple of its input current (in this case, remainder current $I_s$). The output current from current mirror 71 is applied via resistor 73b to summing node SN. Summing node SN is applied to an input of amplifier 74, the output of which is connected to the gates of transistors 75p, 75n as mentioned above. As a result, amplifier 74 generates an analog voltage at its output, on line $PR_f$ that corresponds to the sum of reference current I[prog] and remainder current $I_x$.

It is contemplated that those skilled in the art using well-known design techniques can readily derive the appropriate resistance values for resistors 73a, 73b, as well as the bias of amplifier 74 and the construction of current mirror 71, for a particular implementation of programming logic $70_k$. In addition, the particular arrangement of reference circuit 72 and instances of programming logic $70_k$ among the various columns of memory array 11 and its bit lines BLk can vary. For example, a single reference circuit 72 may be provided for multiple instances of programming logic $70_k$, on the assumption that multiple programming bit line drivers 17k will turn on essentially at the same time in a programming cycle. Conversely, multiple reference circuits 72 may be provided, each supporting one or more instances of programming logic $70_k$. It is contemplated that those skilled in the art can readily arrange these circuit functions in the desired manner for particular memory designs.

In the operation of the embodiment of the invention illustrated in FIG. 10, reference circuit 72 begins ramping up reference current I[prog] as programming bit line driver 17k turns on at the beginning of the programming cycle. Because programming has not yet commenced, remainder current $I_x$ is effectively zero. The sum of reference current I[prog] and the output current from current mirror 71 is thus low at the beginning of the programming cycle, resulting in a low voltage on line $PR_f$. Transistor 75p thus begins the programming cycle in an on state, and transistor 75n is turned off initially. As a result, programming current sourced by programming bit line driver 17k is applied to the drain of memory cell $22_{jk}$.

As memory cell $22_{jk}$ becomes programmed, its drain current $I_d$ eventually begins to flatten, as described above in connection with FIGS. 5a and 5b. As drain current $I_d$ flattens, remainder current $I_x$ increases, increasing the current output by current mirror 71 and thus increasing the summed current at summing node SN, and the resulting output analog voltage from amplifier 74. Upon the sum of reference current I[prog] and remainder current $I_x$ reaching a level that causes amplifier 74 to drive an output voltage on line $PR_f$ that, upon reaching the corresponding threshold voltages, turns off transistor 75p and turns on transistor 75n. This ceases the application of current from programming bit line driver 17k to the selected memory cell $22_{jk}$, and connects source node SRC to the drain of selected memory cell $22_{jk}$.

This embodiment of the invention shown in FIG. 10 provides similar advantages as described above, resulting from the adaptive control of the programming of charge storage memory cells. As described above, termination of the programming mechanism is determined by the response of the memory cell itself as its drain current saturates upon programming. Not only are multiple program-and-verify cycles not required, no verify operation is required whatsoever, improving the efficiency of the programming operation. Over-programming of memory cells is avoided, and more uniform programmed levels among all memory cells in the array is attained. In addition, the programmed levels of the memory cells can be selected and adjusted by way of programmable control, for example by setting the state of a control register. In addition, according to the embodiment of the invention shown in FIG. 10, the reference current is initiated based on the initiation of the programming cycle itself, so that race conditions are avoided without requiring independent timing and control of the reference current from that of the programming drivers.

According to all of the embodiments of this invention, EEPROM memory cells may be programmed by a single pulse, without requiring a verify cycle to determine whether the cells have been programmed to the desired level. This elimination of multiple programming pulses is not only more efficient, but according to embodiments of this invention the risk of over-programming is greatly reduced. In addition, the need to data "mask" previously programmed bits from further programming is avoided according to embodiments of this invention. Embodiments of this invention also provide a more closely controllable distribution of post-programming threshold voltages for programmed memory cells, which is especially useful in multi-level cell (MLC) memories. Other operations, such as "compaction" of erased cell threshold voltages, can be avoided.

Embodiments of this invention attain these advantages by way of a direct sensing arrangement that avoids inaccuracies inherent in current mirror sense amplifiers. In addition, the programming approach of embodiments of this invention is self-compensating, in that variations due to voltage, temperature, or wear are taken into account by the sense and logic circuitry of embodiments of this invention. According to embodiments of this invention, the programmed cell threshold voltage can also be easily modified and changed dynamically, simply by programming or otherwise modulating the level of reference current, without requiring that the programming current change. Embodiments of this invention are compatible with modern "fast" programming schemes in which memory cells within a selected row are sequentially programmed within a single row select cycle, and with single pulse preconditioning prior to block erase.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit comprising:
    a programmable solid-state memory array including a plurality of memory cells arranged in rows and columns, each memory cell including a metal-oxide-semiconductor (MOS) transistor having a gate and a source/drain path;
    a plurality of word lines, each coupled to the gate of the MOS transistor in memory cells in an associated row of the memory array;
    word line drive circuitry, for energizing the word line associated with a selected row of the memory array;
    a plurality of bit lines, each associated with memory cells in an associated column of the memory array;
    at least one programming bit line driver for driving programming current to one or more of the plurality of bit lines in a programming operation; and
    programming logic, comprising:
    switch circuitry, for selectively opening and closing a circuit through which the programming current is conducted via the bit line associated with a selected column of the memory array in the programming operation; and
    circuitry, having a first input coupled to the bit line of the selected column and having a second input coupled to receive a reference current, for controlling the switch circuitry responsive to a remainder current, the remainder current corresponding to a portion of the programming current not conducted by a memory cell in the selected column and the selected row.

2. The integrated circuit of claim 1, wherein the circuitry for controlling the switch circuitry comprises:
    a comparator, having a first input coupled to the bit line of the selected column to receive the remainder current, a second input receiving a reference current, and an output coupled to the programming switch circuitry so that the switch circuitry disconnects opens the circuit responsive to the remainder current exceeding the reference current.

3. The integrated circuit of claim 2, wherein each of the plurality of bit lines is coupled to drains of MOS transistors in memory cells in an associated column of the memory array, the sources of each MOS transistor coupled to a reference voltage;
    wherein the switch circuitry is for coupling the programming current to the bit line associated with a selected column of the memory array in a programming operation.

4. The integrated circuit of claim 3, wherein the switch circuitry comprises, for each of the plurality of bit lines:
    a first transistor, having a source/drain path connected between an output of the programming bit line driver and a corresponding bit line, and having a gate coupled to the output of the comparator; and
    a second transistor, having a source/drain path connected between the corresponding bit line, and the source of one or more MOS transistors in the column corresponding to the bit line, and having a gate coupled to the output of the comparator so that the second transistor is turned on when the first transistor is turned off, and turned off when the first transistor is turned on.

5. The integrated circuit of claim 3, wherein the columns of memory cells in the memory array are arranged into a plurality of groups;
    and wherein the programming logic comprises, for each group of columns:
    switch circuitry, for coupling a programming current to a bit line associated with a selected column in the corresponding group; and
    a comparator, having a first input coupled to the bit line of the selected column in the group, a second input receiving a reference current, and an output coupled to the switch circuitry so that the switch circuitry disconnects the programming current from the bit line responsive to a remainder current at the first input of the comparator exceeding the reference current.

6. The integrated circuit of claim 5, further comprising:
    logic circuitry, having a plurality of inputs, each input coupled to an output of the comparator corresponding to one of the plurality of groups, the logic circuitry for issuing a signal indicating completion of a programming operation.

7. The integrated circuit of claim 5, wherein the switch circuitry comprises, for each column in the group:
    a first transistor, having a source/drain path connected between an output of the programming bit line driver and a corresponding bit line for the column, and having a gate coupled to the output of the comparator; and
    a second transistor of complementary channel conductivity from the first transistor, and having a source/drain path connected between the corresponding bit line, and the source of one or more MOS transistors in the column, and having a gate coupled to the output of the comparator.

8. The integrated circuit of claim 7, wherein the output of the comparator, for a group of columns, is connected to the gates of first and second transistors in each switch circuitry associated with each column in the group.

9. The integrated circuit of claim 2, wherein each of the plurality of bit lines is coupled to drains of MOS transistors in memory cells in an associated column of the memory array;
    wherein the sources of each MOS transistor in each of a plurality of groups of columns are connected in common to a source line;
    wherein the switch circuitry is for selectively coupling the source line to a reference voltage in a programming operation.

10. The integrated circuit of claim 9, wherein the switch circuitry comprises, for each of the plurality of groups of bit lines:
    a first transistor, having a source/drain path connected between the output of the programming bit line driver and the source line, and having a gate coupled to the output of the comparator; and
    a second transistor, having a source/drain path connected between the source line and the reference voltage, and having a gate coupled to the output of the comparator so that the second transistor is turned on when the first transistor is turned off, and turned off when the first transistor is turned on.

11. The integrated circuit of claim 1, wherein the circuitry for controlling the switch circuitry comprises:
- a current mirror, having an input coupled to bit line of the selected column to receive the remainder current, and having an output;
- a reference circuit, having an input coupled to an output of the programming bit line driver, and having an output for presenting the reference current; and
- an amplifier, having an input coupled to a summing node coupled to the outputs of the current mirror and the reference circuit, and having an output coupled to the switch circuitry, for presenting a voltage corresponding to a sum of the reference current and the remainder current.

12. The integrated circuit of claim 11, wherein the switch circuitry comprises:
- a first transistor, having a source/drain path connected between an output of the programming bit line driver and a corresponding bit line, and having a gate coupled to the output of the amplifier; and
- a second transistor, having a source/drain path connected between the corresponding bit line, and the source of one or more MOS transistors in the column corresponding to the bit line, and having a gate coupled to the output of the amplifier so that the second transistor is turned on when the first transistor is turned off, and turned off when the first transistor is turned on.

13. The integrated circuit of claim 1, further comprising:
- a programming source coupled to an input of the programming bit line driver, for generating a programming voltage.

14. The integrated circuit of claim 13, wherein the programming source comprises:
- a charge pump circuit.

15. The integrated circuit of claim 1, wherein the integrated circuit further comprises:
- a logic circuit coupled to the memory array.

16. The integrated circuit of claim 1, wherein the gate of the MOS transistor of each of the plurality of memory cells comprises:
- a floating gate electrode; and
- a control gate electrode.

17. A method of programming memory cells in a programmable solid-state memory array including a plurality of memory cells arranged in rows and columns, wherein each memory cell includes a metal-oxide-semiconductor (MOS) transistor comprising a gate and a source/drain path, the method comprising the steps of:
- applying a programming current to the drain of the MOS transistor of a selected memory cell, the source of the MOS transistor of the selected memory cell being coupled to a reference voltage;
- during the step of applying the programming current, comparing a remainder current from the drain of the MOS transistor of the selected memory cell to a reference current; and
- responsive to the remainder current exceeding the reference current, turning off a first switch transistor to open a circuit including the source/drain path of the MOS transistor of the selected memory cell in series with the first switch transistor.

18. The method of claim 17, wherein the source/drain path of the first switch transistor is connected between a programming current source and the drain of the MOS transistor of the selected memory cell.

19. The method of claim 18, further comprising:
- responsive to the remainder current exceeding the reference current, turning on a second switch transistor, the second switch transistor having a source/drain path connected between the source and drain of the MOS transistor of the selected memory cell.

20. The method of claim 19, wherein the comparing step comprises:
- applying the reference current to a first input of a comparator;
- coupling a second input of the comparator to the drain of the MOS transistor of the selected memory cell;
- coupling an output of the comparator to a gate of each of the first and second switch transistors.

21. The method of claim 17, wherein the source/drain path of the first switch transistor is connected between the source of the MOS transistor of the selected memory cell and a reference voltage.

22. The method of claim 21, further comprising:
- responsive to the remainder current exceeding the reference current, turning on a second switch transistor, the second switch transistor having a source/drain path connected between the source and drain of the MOS transistor of the selected memory cell.

23. The method of claim 22, wherein the comparing step comprises:
- applying the reference current to a first input of a comparator;
- coupling a second input of the comparator to the drain of the MOS transistor of the selected memory cell;
- coupling an output of the comparator to a gate of each of the first and second switch transistors.

24. The method of claim 17, wherein the applying step simultaneously applies a programming current to the drain of a MOS transistor of a plurality of selected memory cells in a plurality of columns of the memory array;
- wherein the comparing step is performed for each of the plurality of selected cells in the plurality of columns;
- and wherein the turning off step is performed for each of the plurality of selected cells in the plurality of columns.

25. The method of claim 24, further comprising:
- generating a programming completion signal responsive to a logic operation on the output of the comparator corresponding to each of the plurality of selected cells.

26. The method of claim 25, further comprising:
- after the generating step, repeating the applying, comparing, and generating steps for each of the memory cells in a block of the memory array; and
- then erasing the memory cells in the block of the memory array.

27. The method of claim 17, wherein the applying step comprises:
- operating a charge pump to generate a programming voltage; and
- applying the programming voltage at an output of the charge pump to a bit line driver in a programming operation.

28. The method of claim 17, wherein the applying step comprises:
- operating an off-chip circuit to generate a programming voltage; and
- applying the programming voltage to a terminal of an integrated circuit including the solid-state memory array, for coupling to a bit line driver in a programming operation.

29. A method of programming memory cells in a programmable solid-state memory array including a plurality of memory cells arranged in rows and columns, wherein each memory cell includes a metal-oxide-semiconductor (MOS) transistor comprising a gate and a source/drain path, the method comprising the steps of:

applying a programming current to the drain of the MOS transistor of a selected memory cell;

responsive to the applying step, generating a reference current;

during the step of applying the programming current, summing a remainder current from the drain of the MOS transistor of the selected memory cell with the reference current;

generating a control voltage responsive to the sum of the remainder and reference currents; and responsive to the control voltage exceeding a threshold voltage, turning off a first switch transistor to open a circuit including the source/drain path of the MOS transistor of the selected memory cell in series with the first switch transistor.

30. The method of claim 29, further comprising:
applying the remainder current to a current mirror, wherein a current at the output of the current mirror is applied to the summing node along with the reference current.

31. The method of claim 29, wherein the first switch transistor has a source/drain path connected in series between a source of the programming current and the drain of the MOS transistor of the selected memory cell; and wherein the source of the MOS transistor of the selected memory cell is coupled to a reference voltage.

32. The method of claim 31, further comprising:
responsive to the control voltage exceeding a threshold voltage, turning on a second switch transistor having a source/drain path connected between the source and the drain of the MOS transistor of the selected memory cell.

33. The method of claim 29, wherein the first switch transistor has a source/drain path connected in series between a reference voltage and the source of the MOS transistor of the selected memory cell.

34. The method of claim 33, further comprising:
responsive to the control voltage exceeding a threshold voltage, turning on a second switch transistor having a source/drain path connected between the source and the drain of the MOS transistor of the selected memory cell.

* * * * *